US012575333B2

(12) United States Patent
van der Straten

(10) Patent No.: US 12,575,333 B2
(45) Date of Patent: Mar. 10, 2026

(54) DIAMOND SHAPED MAGNETIC RANDOM ACCESS MEMORY

(71) Applicant: International Business Machines Corporation, Armonk, NY (US)

(72) Inventor: Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 575 days.

(21) Appl. No.: 17/994,937

(22) Filed: Nov. 28, 2022

(65) Prior Publication Data

US 2024/0180045 A1      May 30, 2024

(51) Int. Cl.
H10N 50/80 (2023.01)
H01L 23/532 (2006.01)
H10B 61/00 (2023.01)
H10N 50/01 (2023.01)

(52) U.S. Cl.
CPC ....... H10N 50/80 (2023.02); H01L 23/53295 (2013.01); H10B 61/00 (2023.02); H10N 50/01 (2023.02)

(58) Field of Classification Search
CPC ... H10N 50/80; H10N 50/10; H10B 61/00–20
See application file for complete search history.

(56) References Cited

U.S. PATENT DOCUMENTS

| | | | |
|---|---|---|---|
| 8,455,965 | B2 | 6/2013 | Li et al. |
| 8,644,063 | B2 | 2/2014 | Li et al. |
| 8,796,795 | B2 | 8/2014 | Satoh et al. |
| 9,025,368 | B2 | 5/2015 | Saida et al. |
| 10,559,751 | B1 | 2/2020 | Yang et al. |
| 10,580,966 | B1 | 3/2020 | van der Straten et al. |
| 11,114,606 | B2 | 9/2021 | Reznicek et al. |
| 2014/0035570 | A1* | 2/2014 | Jin ..................... G01R 33/0005 |
| | | | 324/252 |
| 2015/0056722 | A1 | 2/2015 | Li et al. |
| 2016/0365505 | A1* | 12/2016 | Lu ........................... H10N 50/10 |
| 2018/0040668 | A1* | 2/2018 | Park ....................... H10N 50/10 |
| 2023/0087231 | A1* | 3/2023 | van der Straten ..... H10N 50/80 |
| | | | 257/427 |

* cited by examiner

*Primary Examiner* — William B Partridge
*Assistant Examiner* — Alexandre X Ramirez
(74) *Attorney, Agent, or Firm* — L. Jeffrey Kelly

(57) ABSTRACT

MRAM device structures and techniques for fabrication thereof with improved dielectric gapfill and individually configurable bottom and top encapsulation layers are provided. In one aspect, an MRAM device includes: memory cell pillars having a diamond shaped profile; and an interlayer dielectric fully filling gaps between the memory cell pillars. For instance, each of the memory cell pillars can include a reference layer, a free layer, a tunnel barrier between the reference layer and the free layer, a first encapsulation layer alongside the reference layer, and a second encapsulation layer alongside the free layer; and an interlayer dielectric fully filling gaps between the memory cell pillars. Optionally, the first encapsulation layer can include an oxide dielectric material, and the second encapsulation layer can include a nitride dielectric material. A method of fabricating the present MRAM devices is also provided.

21 Claims, 15 Drawing Sheets

Interlayer dielectrics 502/2902 fully fill intra-pillar gap without voids

DIAMOND SHAPED MAGNETIC RANDOM ACCESS MEMORY

BACKGROUND

The present invention relates to magnetic random access memory (MRAM), and more particularly, to diamond shaped MRAM device structures and techniques for fabrication thereof with improved dielectric gapfill and individually configurable bottom and top encapsulation layers.

Magnetic random access memory (MRAM) is a nonvolatile random access memory technology. For high performance MRAM devices based on perpendicular magnetic tunnel junction (MTJ) structures, well-defined interfaces and interface control are important.

MRAM uses magnetic memory cells to store information. Information is stored in the magnetic memory cells as an orientation of the magnetization of a free layer as compared to an orientation of the magnetization of a fixed or reference layer in each of the magnetic memory cells.

Embedded MRAM devices are often formed by subtractive patterning of blanket MTJ stacks into individual pillars between two metal levels. After MTJ stack patterning, the inter-pillar spaces are filled with dielectric to enable connection to back-end-of-line wiring. However, the dielectric gapfill between pillars presents a notable challenge. Namely, the presence of any voids in the dielectric between the pillars can lead to shorts. More specifically, during subsequent metallization, voids in the dielectric between the pillars can become filled with metal thus creating a direct short between neighboring pillars.

Thus, MRAM designs and techniques for fabrication thereof which improve dielectric gapfill properties enabling void-free structures would be desirable.

SUMMARY

The present invention provides diamond shaped magnetic random access memory (MRAM) devices and techniques for fabrication thereof with improved dielectric gapfill and individually configurable bottom and top encapsulation layers. In one aspect of the invention, an MRAM device is provided. The MRAM device includes: memory cell pillars having a diamond shaped profile; and an interlayer dielectric fully filling gaps between the memory cell pillars. For instance, each of the memory cell pillars can have a top with a width $W_{TOP}$, a bottom with a width $W_{BOTTOM}$, and a middle with a width $W_{MIDDLE}$, where $W_{MIDDLE} > W_{TOP}$, and wherein $W_{MIDDLE} > W_{BOTTOM}$.

In another aspect of the invention, another MRAM device is provided. The MRAM device includes: memory cell pillars having a diamond shaped profile, where each of the memory cell pillars includes a reference layer, a free layer, a tunnel barrier between the reference layer and the free layer, a first encapsulation layer alongside the reference layer, and a second encapsulation layer alongside the free layer; and an interlayer dielectric fully filling gaps between the memory cell pillars. Optionally, the first encapsulation layer can include an oxide dielectric material, and the second encapsulation layer can include a nitride dielectric material.

In yet another aspect of the invention, a method of fabricating an MRAM device is provided. The method includes: patterning at least one tapered trench in an interlayer dielectric over at least one first metal line; forming a bottom half of at least one memory cell pillar in the at least one tapered trench; forming a top half of the at least one memory cell pillar over the bottom half of the at least one memory cell pillar, where the top half of the at least one memory cell pillar has a tapered sidewalls such that the at least one memory cell pillar has a diamond shaped profile; depositing another interlayer dielectric over the top half of the at least one memory cell pillar; and forming at least one second metal line over the at least one memory cell pillar.

A more complete understanding of the present invention, as well as further features and advantages of the present invention, will be obtained by reference to the following detailed description and drawings.

DETAILED DESCRIPTION

Magnetic random access memory (MRAM) uses magnetic memory cells to store information. Information is stored in the magnetic memory cells as an orientation of the magnetization of a free layer as compared to an orientation of the magnetization of a fixed or reference layer in each of the magnetic memory cells. The magnetization of the free layer can be oriented parallel or anti-parallel relative to the fixed layer, representing either a logic '1' or a logic '0.' When the magnetic memory cell is sitting in a zero applied magnetic field, the magnetization of the magnetic memory cell is stable. Hence, the memory is nonvolatile. The application of a magnetic field can switch the magnetization of the free layer to write information to the magnetic memory cell.

As highlighted above, fabrication of an MRAM device typically involves blanket deposition of the various layers, followed by subtractive patterning of the layers into individual memory cell pillars. As a result of this process, conventional memory cell pillars have straight vertical sidewalls. However, during subsequent dielectric gapfill between the pillars, the dielectric can get pinched off at the top of the inter-pillar space creating voids between the pillars. These voids can then become filled with metal during a later metallization process, thereby undesirably leading to direct shorts between neighboring pillars.

Advantageously, provided herein are MRAM devices and techniques for fabrication thereof where the pillars have a unique diamond shaped profile that facilitates interlayer dielectric gapfill between the pillars without any void formation. Namely, by providing a diamond shaped pillar profile that widens at the top, the risk of pinching off the inter-pillar space is eliminated. As will be described in detail below, the present techniques begin by building each pillar from the bottom-up, in order to create low aspect ratio inter-pillar spaces for void-free dielectric gapfill. Advantageously, the present process can be leveraged to employ different bottom and top encapsulation layers for the pillars which is beneficial because it allows for design flexibility in terms of the type of interlayer dielectric materials which can be used, having good adhesion to specific encapsulation materials, and it allows for tailoring of overall capacitance.

Figure 1:
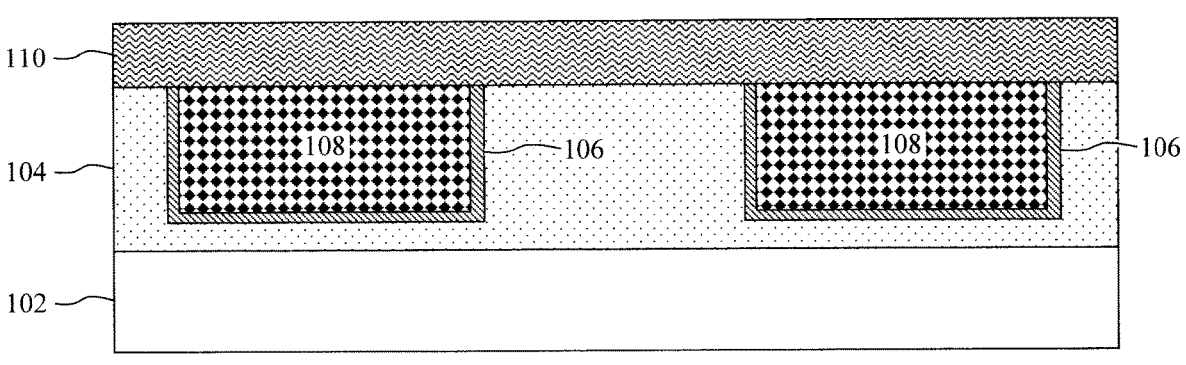
FIG. 1 is a cross-sectional diagram illustrating a (first) interlayer dielectric having been deposited on a wafer, at least one metal line having been formed in the first interlayer dielectric, and a dielectric cap having been deposited onto the first interlayer dielectric over the metal line(s) according to an embodiment of the present invention.

An exemplary methodology for fabricating an MRAM device in accordance with the present techniques is now described by way of reference to FIGS. 1-26. As shown in FIG. 1, the process begins with the deposition of an interlayer dielectric 104 on a wafer 102, the formation of at least one metal line 108 in the interlayer dielectric 104, and the deposition of a dielectric cap 110 onto the interlayer dielectric 104 over the metal line(s) 108.

According to an exemplary embodiment, the wafer 102 is a bulk semiconductor wafer, such as a bulk silicon (Si), bulk germanium (Ge), bulk silicon germanium (SiGe) and/or bulk III-V semiconductor wafer. Alternatively, the wafer 102 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, the wafer 102 may already have pre-built structures (not shown) such as transistors, diodes, capacitors, resistors, interconnects, wiring, etc.

Suitable interlayer dielectric 104 materials include, but are not limited to, silicon nitride (SiN), silicon oxycarbide (SiOC), hydrogen-containing silicon oxycarbide (SiCOH), silicon oxycarbonitride (SiCNO) and/or hydrogen-containing silicon oxycarbonitride (SiCHNO) and/or oxide low-κ materials such as silicon oxide (SiOx) and/or oxide ultralow-κ interlayer dielectric (ULK-ILD) materials, e.g., having a dielectric constant κ of less than 2.7, which can be deposited using a process such as chemical vapor deposition (CVD), plasma enhanced chemical vapor deposition (PECVD), atomic layer deposition (ALD), physical vapor deposition (PVD) or a casting process such as spin-coating. Suitable ultralow-κ dielectric materials include, but are not limited to, porous organosilicate glass (pSiCOH). Following deposition, the interlayer dielectric 104 can be planarized using a process such as chemical-mechanical polishing.

To form the metal line(s) 108 in the interlayer dielectric 104, standard lithography and etching techniques can be employed to pattern features (e.g., trenches and/or vias) in the interlayer dielectric 104. With standard lithography and etching techniques, a lithographic stack (not shown), e.g., photoresist/anti-reflective coating/organic planarizing layer, is used to pattern a hardmask (not shown) with the footprint and location of the features. An etch employing the hardmask is then used to pattern the features in the interlayer dielectric 104.

The features are then filled with a contact metal(s) to form the metal line(s) 108. Suitable contact metals include, but are not limited to, copper (Cu), nickel (Ni), platinum (Pt), ruthenium (Ru), cobalt (Co) and/or tungsten (W), which can be deposited using a process such as evaporation, sputtering, or electrochemical plating. Following deposition, the metal overburden can be removed using a process such as chemical-mechanical polishing.

Prior to depositing the contact metal(s) into the features, a conformal barrier layer 106 can be deposited into and lining the features. Use of such a barrier layer helps to prevent diffusion of the contact metal(s) into the surrounding interlayer dielectric 104. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the features prior to deposition of the contact metal(s). A seed layer facilitates plating of the contact metal(s) into the features.

Suitable dielectric cap 110 materials include, but are not limited to, SiN, silicon carbide (SiC) and/or SiOC which can be deposited using a process such as CVD, ALD, or PVD. According to an exemplary embodiment, the dielectric cap 110 has a thickness of from about 2 nanometers (nm) to about 40 nm.

Figure 2:
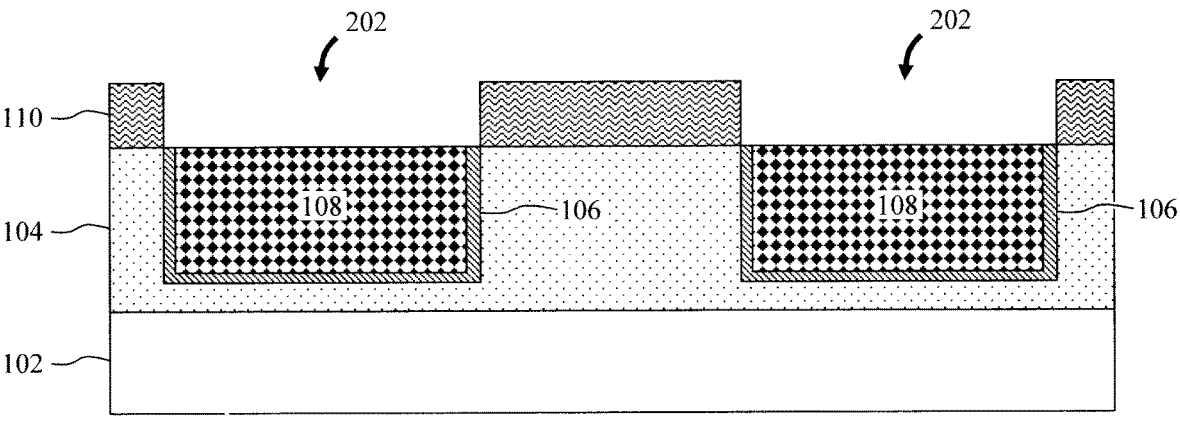
FIG. 2 is a cross-sectional diagram illustrating openings having been patterned in the dielectric cap over the metal line(s) according to an embodiment of the present invention.
Figure 3:
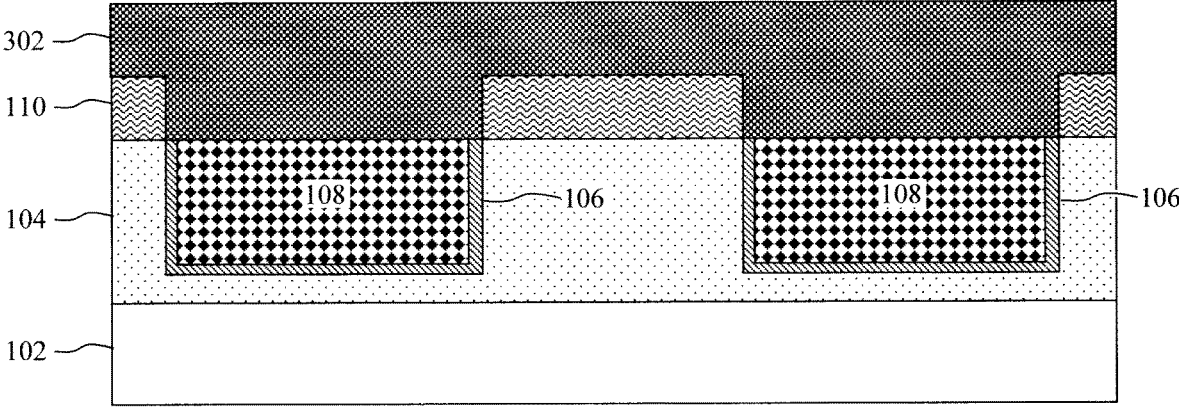
FIG. 3 is a cross-sectional diagram illustrating a metal cap material having been deposited onto the dielectric cap and into/filling the openings according to an embodiment of the present invention.

As shown in FIG. 2, openings 202 are then patterned in the dielectric cap 110 over the metal line(s) 108. Standard lithography and etching processes (see above) can be employed to pattern the openings 202. As shown in FIG. 3, a metal cap material 302 is then deposited onto the dielectric cap 110 and into/filling the openings 202.

Figure 4:
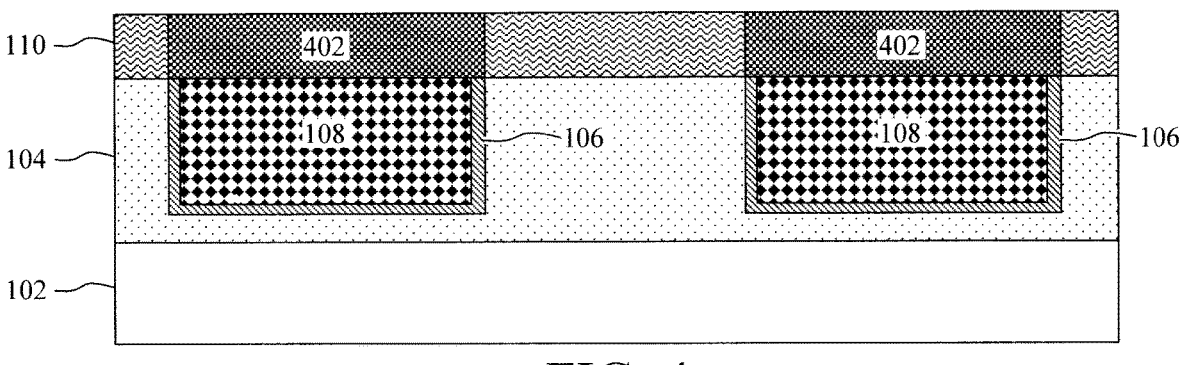
FIG. 4 is a cross-sectional diagram illustrating the metal cap material having been planarized to form individual metal caps in the openings over the metal line(s) according to an embodiment of the present invention.
Figure 5:
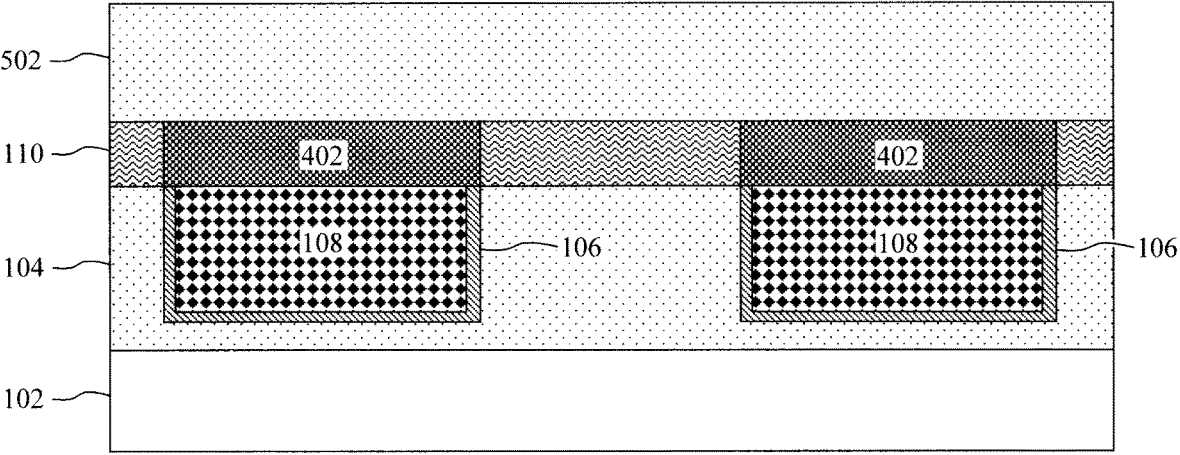
FIG. 5 is a cross-sectional diagram illustrating a (second) interlayer dielectric having been deposited onto the dielectric cap over the metal caps according to an embodiment of the present invention.

Suitable metal cap materials include, but are not limited to, Ru, W, molybdenum (Mo), and metal nitrides such as TaN or TiN, which can be deposited using a process such as CVD, PVD, evaporation, or sputtering. As shown in FIG. 4, following deposition, the metal cap material 302 is planarized to form individual metal caps 402 in the openings 202 over the metal line(s) 108. A process such as chemical mechanical polishing can be employed to planarize the metal cap material 302. As a result, the top surface of the metal caps 402 is coplanar with the top surface of the interlayer dielectric 104. The dielectric cap 110/metal caps 402 will serve to prevent diffusion of the metal line(s) 108 into the surrounding interlayer dielectric 104.

An interlayer dielectric 502 is then deposited onto the dielectric cap 110 over the metal caps 402. For clarity, the terms 'first' and 'second' may also be used herein when referring to interlayer dielectric 104 and interlayer dielectric 502, respectively. Suitable interlayer dielectric 502 materials include, but are not limited to, SiN, SiOC and/or oxide low-K materials such as SiOx and/or ULK-ILD materials such as pSiCOH, which can be deposited using a process such as CVD, ALD or PVD. Following deposition, the interlayer dielectric 502 can be planarized using a process such as chemical-mechanical polishing.

Figure 6:
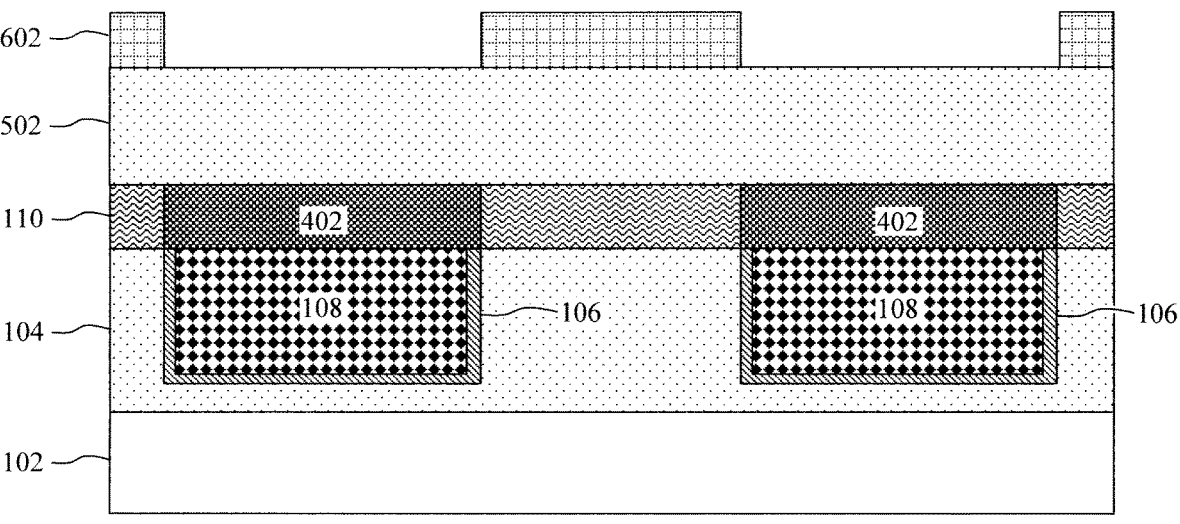
FIG. 6 is a cross-sectional diagram illustrating a patterned hardmask having been formed on the second interlayer dielectric according to an embodiment of the present invention.

As shown in FIG. 6, standard lithography and etching processes (see above) are then used to form a patterned hardmask 602 on the interlayer dielectric 502. Suitable hardmask materials include, but are not limited to, SiN, silicon dioxide (Si(2), titanium nitride (TiN) and/or silicon oxynitride (SiON).

Figure 7:
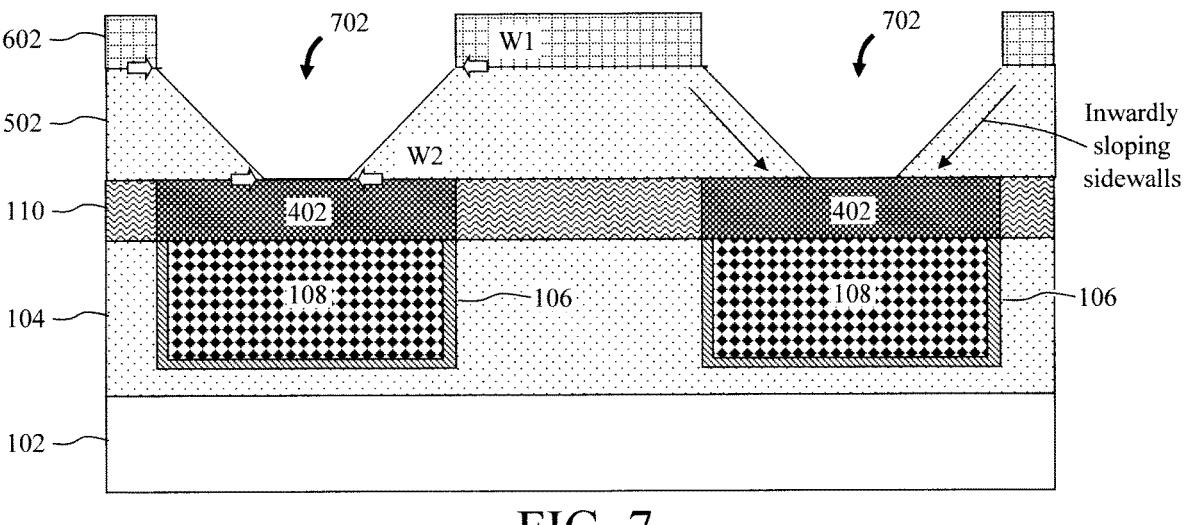
FIG. 7 is a cross-sectional diagram illustrating a tapered etch using the patterned hardmask having been performed to create tapered trenches in the second interlayer dielectric over the metal line(s) according to an embodiment of the present invention.

As shown in FIG. 7, a tapered etch using the patterned hardmask 602 is then performed to create tapered trenches 702 in the interlayer dielectric 502 over the metal line(s) 108. Namely, tapered trenches 702 have inwardly sloping sidewalls going from the top to the bottom of the tapered trenches 702. As a result, the top of the tapered trenches 702 has a width W1 and the bottom of the tapered trenches 702 has a width W2, where W1 is greater than (>) W2. As will be described in detail below, this tapered design will enable formation of the bottom half of the diamond shaped memory cell pillars that will be formed in the tapered trenches 702 (rather than by subtractive patterning of blanket films).

According to an exemplary embodiment, the tapered etch is performed using an ion beam etching process. Ion beam etching uses a directed beam of charged particles (i.e., ions) to carry out material removal on a substrate. Advantageously, ion beam etching enables a sample to be tilted in order to alter the direction of impact of the ion beam, thereby achieving an angled etch such as that which is used to create the tapered trenches 702. Metal caps 402 act as an etch stop for the tapered etch. Thus, as shown in FIG. 7, the metal caps 402 are exposed at the bottoms of the tapered trenches 702.

Figure 8:
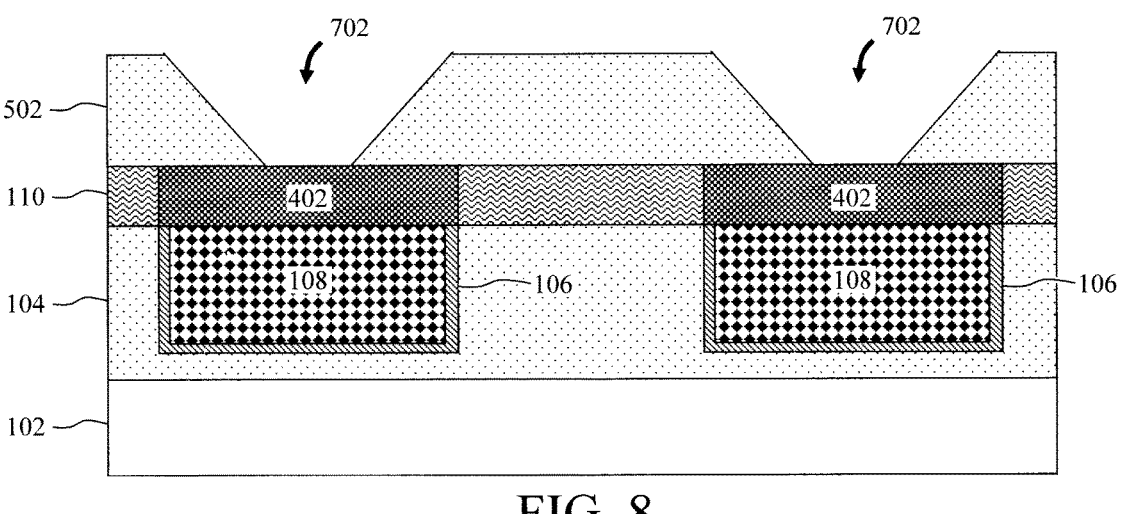
FIG. 8 is a cross-sectional diagram illustrating the patterned hardmask having been removed following the tapered etch according to an embodiment of the present invention.
Figure 9:
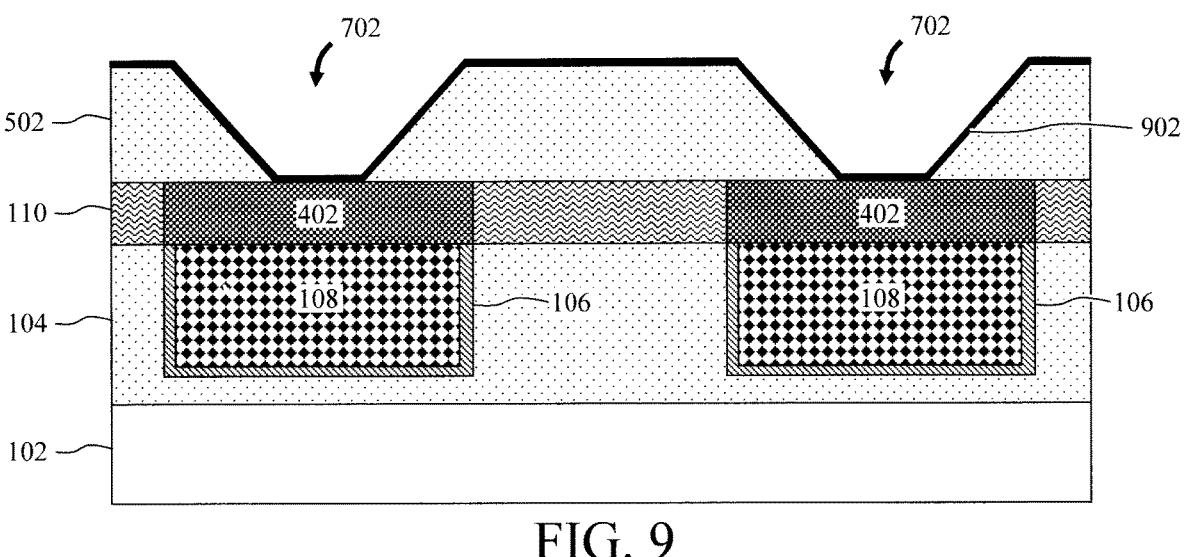
FIG. 9 is a cross-sectional diagram illustrating a (first) encapsulation layer having been deposited onto the second interlayer dielectric and metal caps, including within the tapered trenches according to an embodiment of the present invention.

As shown in FIG. 8, what remains of the patterned hardmask 602 is removed following the tapered etch. Removal of the patterned hardmask 602 will enable the blanket deposition of an encapsulation layer. Namely, as shown in FIG. 9, an encapsulation layer 902 is next deposited onto the interlayer dielectric 502 and metal caps 402, including within the tapered trenches 702. The as-deposited encapsulation layer 902 is conformal to the topography of the interlayer dielectric 502 and underlying metal caps 402.

More specifically, the encapsulation layer 902 directly contacts the interlayer dielectric 502 along its top surface and along the inwardly sloping sidewalls of the tapered trenches 702. The encapsulation layer 902 directly contacts a (top) portion of the metal caps 402 exposed at the bottom of the tapered trenches 702.

The encapsulation layer 902 serves to protect the interlayer dielectric 502 during the subsequent processing steps that will be performed to form the diamond shaped memory cell pillars in the tapered trenches 702. As highlighted above, the present techniques advantageously enable the use of different encapsulation layer materials along the bottom half vis-à-vis the top half of the diamond shaped memory cell pillars. In that case, a different encapsulation layer material will be present along the sidewalls of the reference layer (see below) which will be in the bottom half of the diamond shaped memory cell pillars as compared to along the sidewalls of the free layer (see below) which will be in the top half of the diamond shaped memory cell pillars. More specifically, a first encapsulation layer material can be employed along the sidewalls of the reference layer and a second, different, encapsulation layer material can be employed along the sidewalls of the free layer.

Thus, in one exemplary embodiment, encapsulation layer 902 is formed from a different dielectric material than the encapsulation layer that will be formed along the top half of the diamond shaped memory cell pillars. In that case, suitable materials for encapsulation layer 902 include, but are not limited to, oxide dielectric materials such as hafnium oxide ($HfO_2$) and/or yttrium oxide ($Y_2O_3$).

However, employing different encapsulation layer materials along the sidewalls of the reference layer vis-à-vis the free layer is not a requirement, and embodiments are also contemplated herein where the same dielectric material is used in both the bottom half and the top half of the diamond shaped memory cell pillars. In that case, suitable materials for encapsulation layer 902 include, but are not limited to, nitride dielectric materials such as silicon nitride (SiN), aluminum doped silicon nitride (SiAlN) and/or silicon carbonitride (SiCN).

In either case, the encapsulation layer 902 can be deposited using a process such as CVD, PECVD. ALD or PVD. According to an exemplary embodiment, the encapsulation layer 902 has a thickness of from about 1 nm to about 5 nm.

Figure 10:
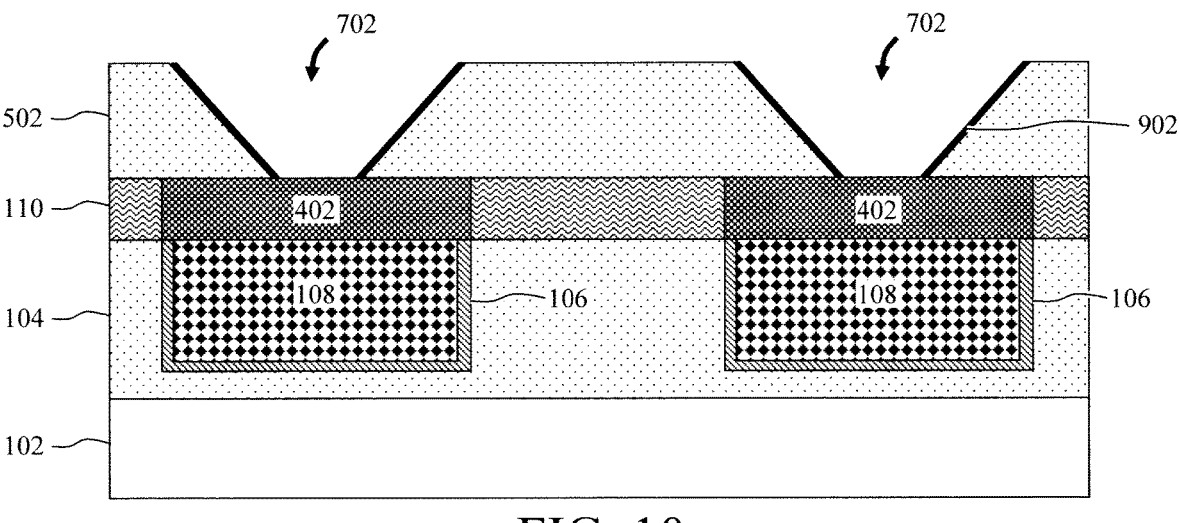
FIG. 10 is a cross-sectional diagram illustrating an etchback of the first encapsulation layer having been performed according to an embodiment of the present invention.

As shown in FIG. 10, an etch-back of the encapsulation layer 902 is next performed, which removes the encapsulation layer 902 from all horizontal surfaces including from the top surface of the interlayer dielectric 502 and from the top surface of the metal caps 402 at the bottom of the tapered trenches 702. According to an exemplary embodiment, etch-back of the encapsulation layer 902 is performed using a directional (i.e., anisotropic) etching process such as reactive ion etching. As a result, the encapsulation layer 902 will remain, as shown in FIG. 10, along only the inwardly sloping sidewalls of the tapered trenches 702.

Figures 11, 12:
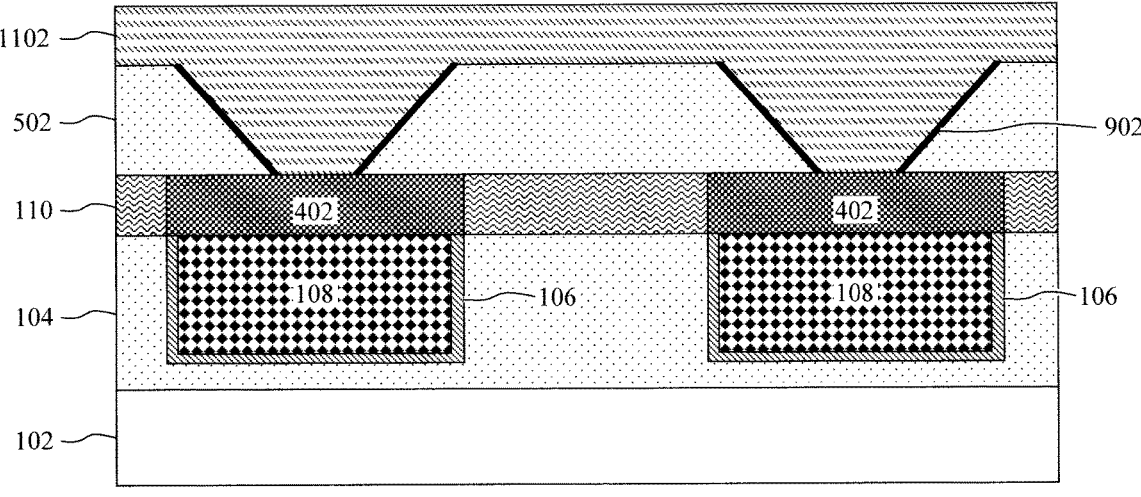
FIG. 11 is a cross-sectional diagram illustrating an electrode material having been deposited onto the second interlayer dielectric including within the tapered trenches over the encapsulation layer according to an embodiment of the present invention.
FIG. 12 is a cross-sectional diagram illustrating an overburden of the electrode material having been removed according to an embodiment of the present invention.

As shown in FIG. 11, an electrode material 1102 is deposited onto the interlayer dielectric 502 including within the tapered trenches 702 over the encapsulation layer 902. Suitable electrode materials 1102 include, but are not limited to, metal nitrides such as niobium nitride (NbN) and/or tungsten carbon nitride (WCN), and/or metals such as molybdenum (Mo), tantalum (Ta), tungsten (W), rhodium (Rh), ruthenium (Ru) and/or platinum (Pt), which can be deposited using a process such as CVD, PECVD, ALD, PVD, evaporation, sputtering, or electrochemical plating.

As shown in FIG. 11, the encapsulation layer 902 is present between the interlayer dielectric 502 and the electrode material 1102 along the inwardly sloping sidewalls of the tapered trenches 702. However, the electrode material 1102 directly contacts the metal caps 402. As such, the bottom electrode that will be formed from the electrode material 1102 will also directly contact the metal caps 402. Following deposition of the electrode material 1102, the overburden is removed. See FIG. 12. A process such as chemical mechanical polishing can be used to remove the overburden of electrode material 1102 stopping on the interlayer dielectric 502.

Figure 13:
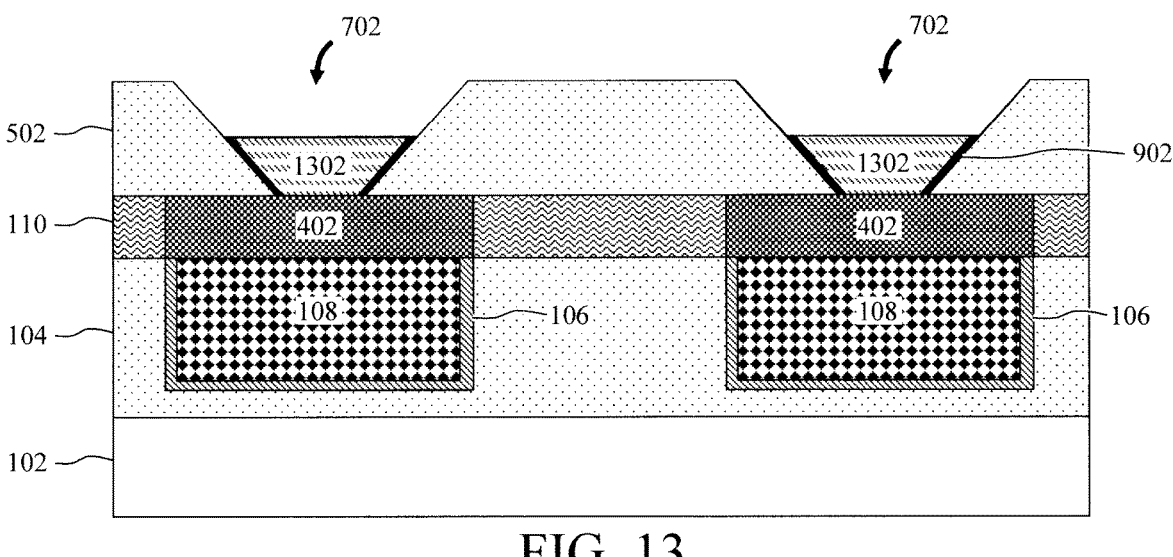
FIG. 13 is a cross-sectional diagram illustrating the electrode material and the first encapsulation layer having been recessed below the tops of the tapered trenches thereby forming bottom electrodes according to an embodiment of the present invention.

As shown in FIG. 13, the electrode material 1102 and encapsulation layer 902 are recessed (below the tops of the tapered trenches 702) thereby forming bottom electrodes 1302 in the tapered trenches 702 over the metal line(s) 108 that are separated from the interlayer dielectric 502 along the inwardly sloping sidewalls of the tapered trenches 702 by the encapsulation layer 902. Bottom electrodes 1302 directly contact the metal caps 402. A directional (i.e., anisotropic) etching process such as reactive ion etching can be employed for the recess etch of the electrode material 1102 and encapsulation layer 902.

Figure 14:
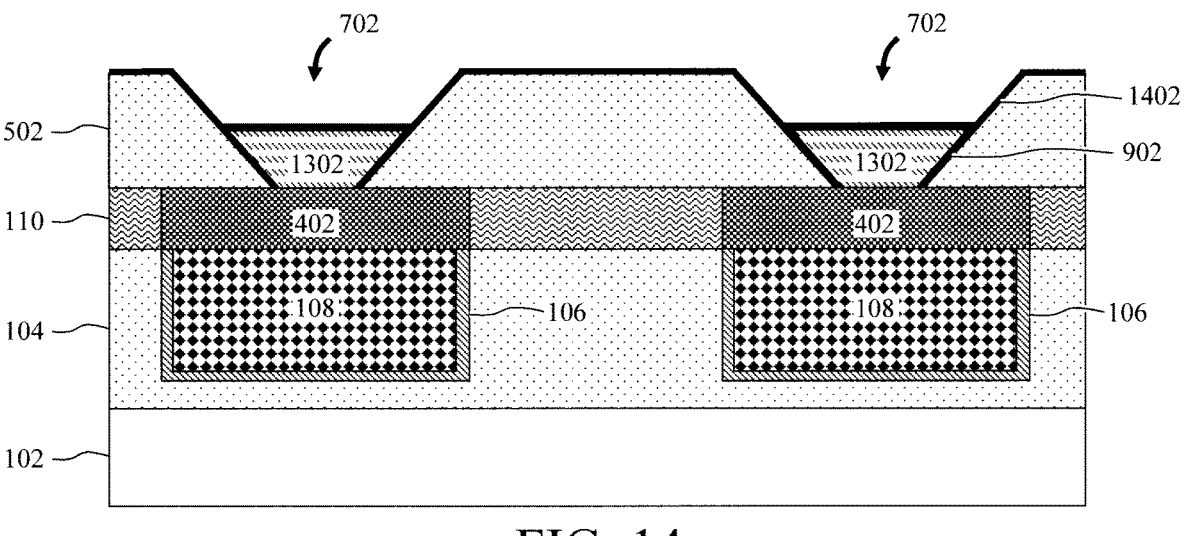
FIG. 14 is a cross-sectional diagram illustrating another encapsulation layer having been deposited onto the interlayer dielectric and into the tapered trenches over the bottom electrodes according to an embodiment of the present invention.

As shown in FIG. 14, an encapsulation layer 1402 is next deposited onto the interlayer dielectric 502 and into the tapered trenches 702 over the bottom electrodes 1302. The as-deposited encapsulation layer 1402 is conformal to the topography of the interlayer dielectric 502 and the bottom electrodes 1302. More specifically, the encapsulation layer 1402 directly contacts the interlayer dielectric 502 along its top surface and along the inwardly sloping sidewalls of the tapered trenches 702 exposed above the bottom electrodes 1302. The encapsulation layer 1402 directly contacts a (top) portion of the bottom electrodes 1302.

Encapsulation layer 1402 together with encapsulation layer 902 will collectively form what is also referred to generally below as a 'first' encapsulation layer that will be present on the bottom half of the diamond shaped memory cell pillars along the sidewalls of the bottom electrodes 1302 and what will be the reference layer (see below). By comparison, a 'second' encapsulation layer will be formed on the top half of the diamond shaped memory cell pillars along the sidewalls of what will be the free layer and the top electrode (see above). As highlighted above, the first encapsulation layer and the second encapsulation layer can be formed from the same, or from different materials.

In either case, according to an exemplary embodiment, the materials used for the encapsulation layer 902 and the encapsulation layer 1402 are selected from the same group of dielectric materials. Thus, when the first encapsulation layer and the second encapsulation layer are formed from the same materials, suitable materials for encapsulation layer 1402 include, but are not limited to, nitride dielectric materials such as SiN, SiAlN and/or SiCN. Alternatively, in the case where the first encapsulation layer and the second encapsulation layer are formed from different materials (e.g., oxide and nitride dielectric materials respectively), suitable materials for encapsulation layer 1402 include, but are not limited to, oxide dielectric materials such as $HfO_2$ and/or $Y_2O_3$.

A process such as CVD, PECVD, ALD or PVD can be used to deposit the encapsulation layer 1402. According to an exemplary embodiment, the encapsulation layer 1402 has a thickness of from about 1 nm to about 5 nm.

Figure 15:
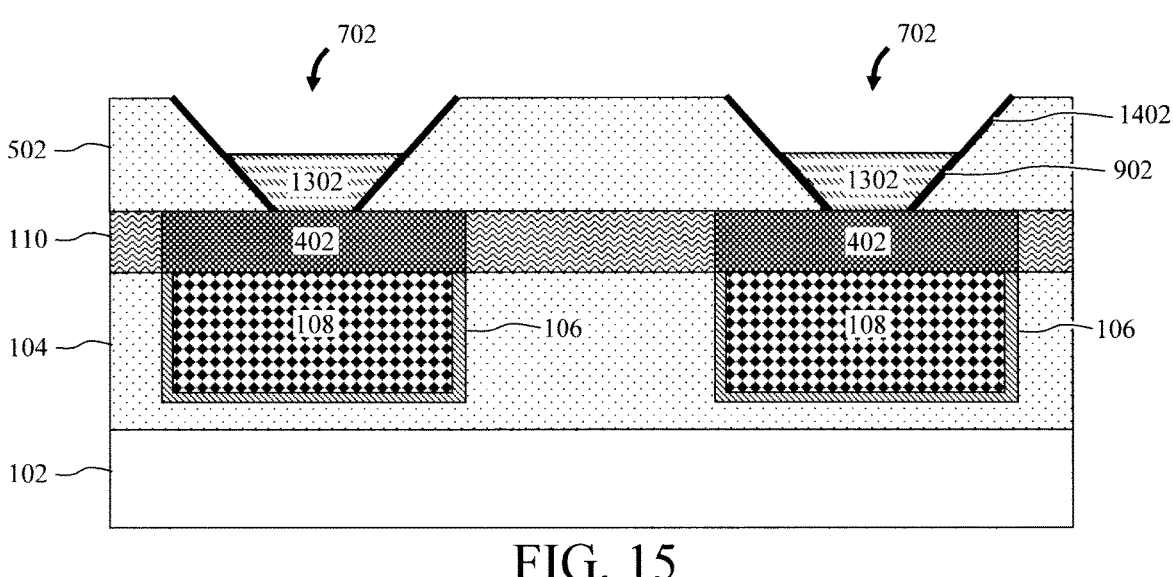
FIG. 15 is a cross-sectional diagram illustrating an etch-back of the other encapsulation layer having been performed according to an embodiment of the present invention.

As shown in FIG. 15, an etch-back of the encapsulation layer 1402 is next performed, which removes the encapsulation layer 1402 from all horizontal surfaces including from the top surface of the interlayer dielectric 502 and from the top surface of bottom electrodes 1302. According to an exemplary embodiment, etch-back of the encapsulation layer 1402 is performed using a directional (i.e., anisotropic) etching process such as reactive ion etching. As a result, the encapsulation layer 902 and the encapsulation layer 1402 are now present, as shown in FIG. 15, along the inwardly sloping sidewalls of the tapered trenches 702.

Figure 16:
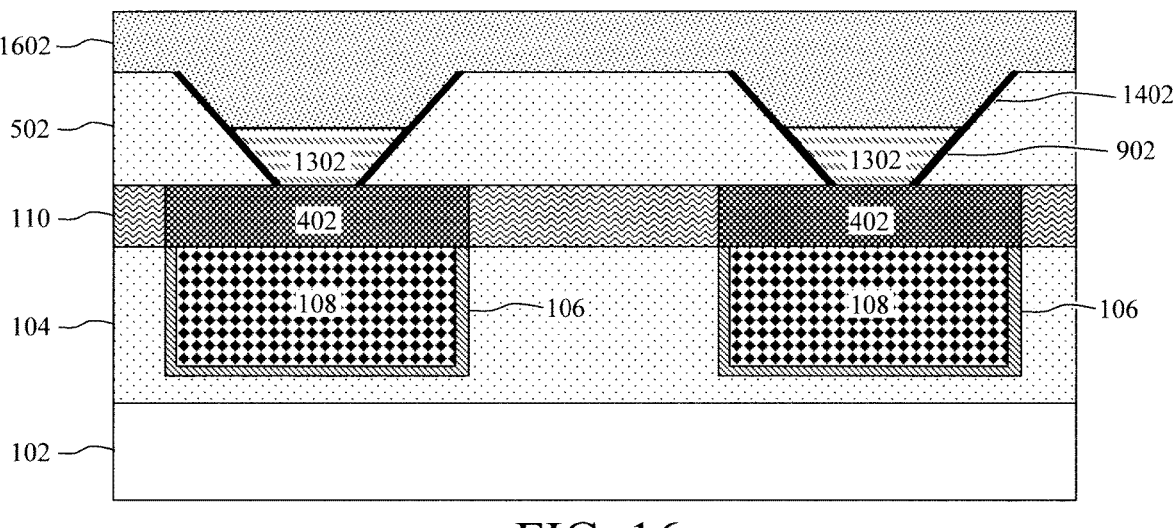
FIG. 16 is a cross-sectional diagram illustrating a reference layer material having been deposited onto the interlayer dielectric including within the tapered trenches over the other encapsulation layer according to an embodiment of the present invention.

As shown in FIG. 16, a reference layer material 1602 is deposited onto the interlayer dielectric 502 including within the tapered trenches 702 over the encapsulation layer 1402. Suitable reference layer materials 1602 include, but are not limited to, ferromagnetic materials such as nickel (Ni), iron (Fe), cobalt (Co) and/or alloys thereof such as cobalt-iron-boron (CoFeB), which can be present in a single layer of the foregoing ferromagnetic materials or, alternatively, in multiple layers each containing at least one of the foregoing ferromagnetic materials. A process such as PVD, evaporation, sputtering, or electrochemical plating can be employed to deposit the reference layer material 1602.

Figure 17:
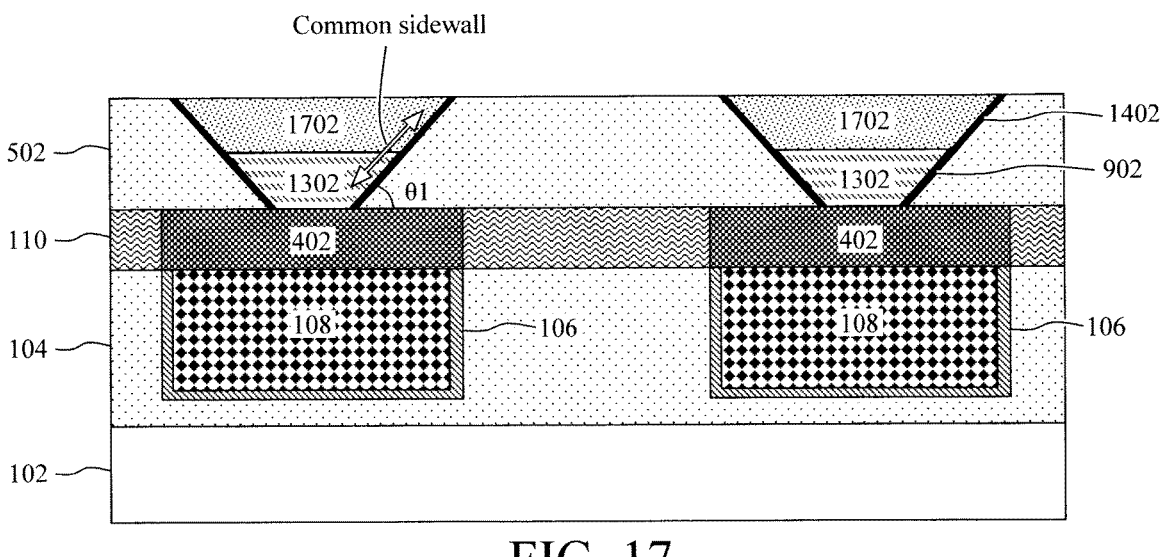
FIG. 17 is a cross-sectional diagram illustrating an overburden of the reference layer material having been removed thereby forming reference layers according to an embodiment of the present invention.

As shown in FIG. 16, the encapsulation layer 1402 is present between the interlayer dielectric 502 and the reference layer material 1602 along the inwardly sloping sidewalls of the tapered trenches 702. However, the reference layer material 1602 directly contacts the bottom electrodes 1302. As such, the reference layers that will be formed from the reference layer material 1602 will also directly contact the bottom electrodes 1302. Following deposition of the reference layer material 1602, the overburden is removed, forming reference layers 1702 which directly contact the bottom electrodes 1302. See FIG. 17. A process such as chemical mechanical polishing can be used to remove the overburden of the reference layer material 1602 stopping on the interlayer dielectric 502. As shown in FIG. 17, the bottom electrodes 1302 and the reference layers 1702 share common tapered sidewalls, i.e., which taper inward from what will be the middle of the memory cell pillars to the bottom (see below). For instance, according to an exemplary embodiment, one of the common sidewalls of the bottom electrodes 1302 and the reference layers 1702 in each of the memory cell pillars forms an angle $\theta 1$ of from about 30 degrees to about 50 degrees relative to the top surfaces of the metal caps 402/interlayer dielectric 104 (which are coplanar—see above). The bottom electrodes 1302 and the reference layers 1702 will also be referred to herein collectively as the 'bottom halves' of the present diamond shaped memory cell pillars.

Figure 18:
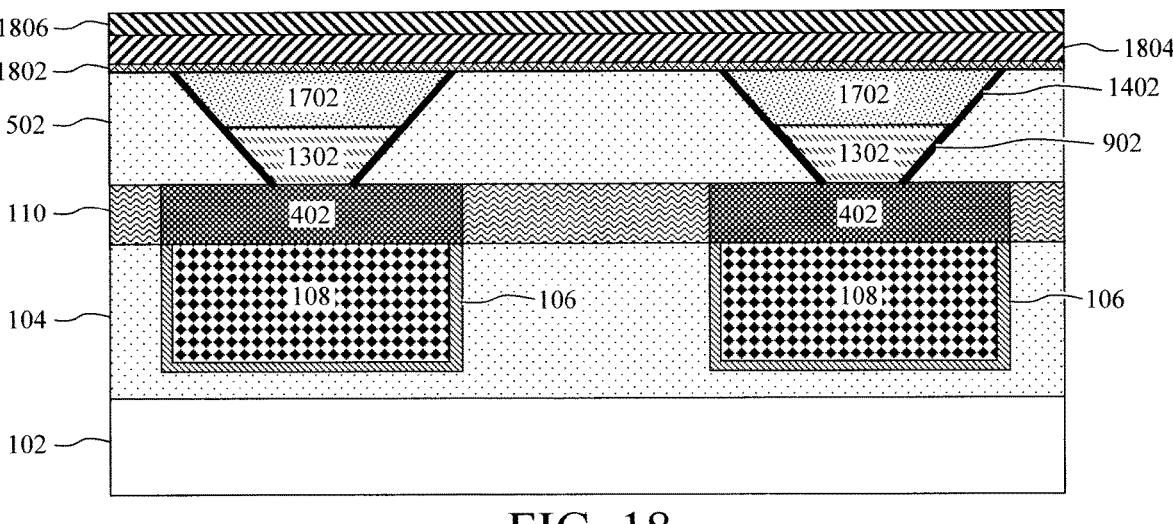
FIG. 18 is a cross-sectional diagram illustrating a blanket tunnel barrier layer having been deposited onto the second interlayer dielectric over the reference layers, a blanket free layer having been deposited directly onto the blanket tunnel barrier layer, and a blanket top electrode layer having been deposited directly onto the blanket free layer according to an embodiment of the present invention.

As shown in FIG. 18, a blanket tunnel barrier layer 1802 is deposited onto the interlayer dielectric 502 over (and in direct contact with) the reference layers 1702, a blanket free layer 1804 is deposited directly onto the blanket tunnel barrier layer 1802, and a blanket top electrode layer 1806 is deposited directly onto the blanket free layer 1804. The term 'blanket' refers to the notion that these layers are deposited over multiple reference layers 1702 and will serve as the basis for forming the upper half of multiple diamond shaped memory cell pillars.

Suitable materials for the blanket tunnel barrier layer 1802 include, but are not limited to, metal oxides such as aluminum oxide (AlOx) and/or magnesium oxide (MgO), which can be deposited using a process such as CVD, ALD or PVD. According to an exemplary embodiment, the blanket tunnel barrier layer 1802 has a thickness of from about 0.5 nm to about 1.5 nm.

Suitable materials for the blanket free layer 1804 include, but are not limited to, ferromagnetic materials such as Ni, Fe, Co and/or alloys thereof such as CoFeB, which can be present in a single layer of the foregoing ferromagnetic materials or, alternatively, in multiple layers each containing at least one of the foregoing ferromagnetic materials. A process such as PVD, evaporation, sputtering, or electrochemical plating can be employed to deposit the blanket free layer 1804.

Suitable materials for the blanket top electrode layer 1806 include, but are not limited to, metal nitrides such as NbN and/or WCN, and/or metals such as Mo, Ta, W, Rh, Ru and/or Pt. A process such as CVD, PECVD, ALD, PVD, evaporation, sputtering, or electrochemical plating can be employed to deposit the blanket top electrode layer 1806.

Figure 19:
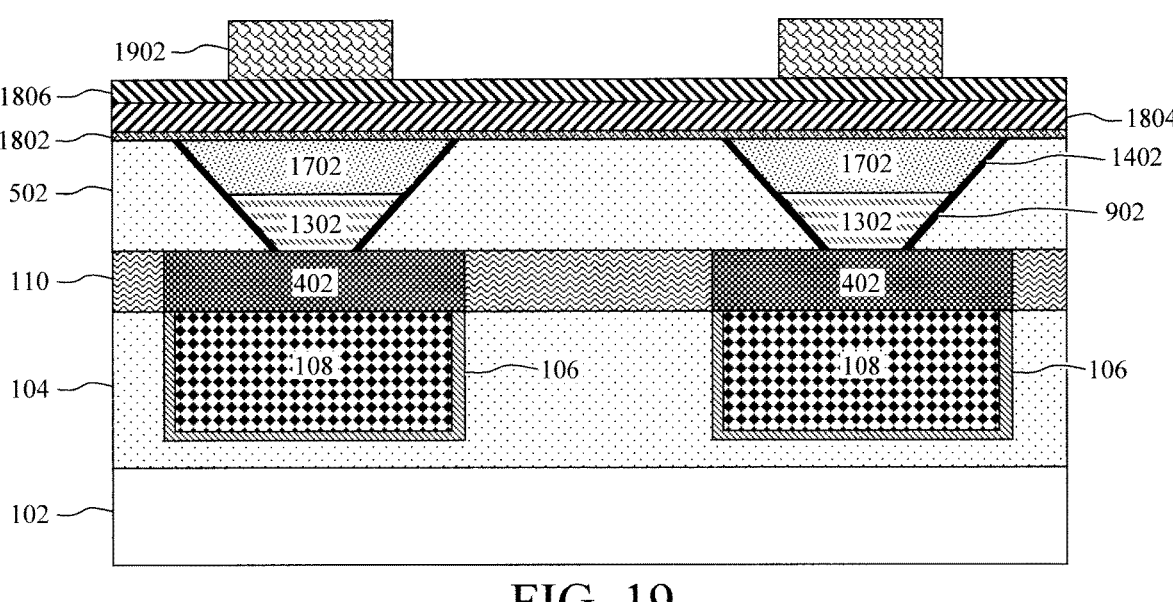
FIG. 19 is a cross-sectional diagram illustrating a patterned hardmask having been formed on the blanket top electrode layer according to an embodiment of the present invention.

As shown in FIG. 19, standard lithography and etching processes (see above) are then used to form a patterned hardmask 1902 on the blanket top electrode layer 1806. Suitable hardmask materials include, but are not limited to, SiN, SiO₂, TiN and/or SiON.

Figure 20:
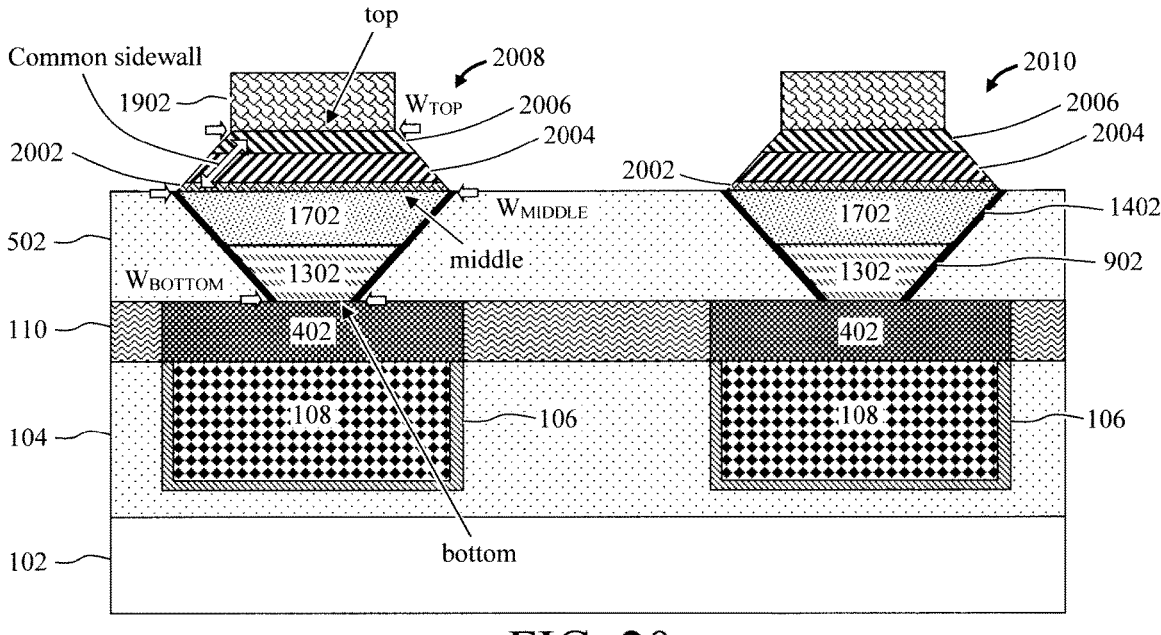
FIG. 20 is a cross-sectional diagram illustrating a tapered etch having been performed to create tunnel barriers on the reference layers, free layers on the tunnel barriers, and top electrodes on the free layers to form at least a first and a second diamond shaped memory cell pillar according to an embodiment of the present invention.
Figure 21:
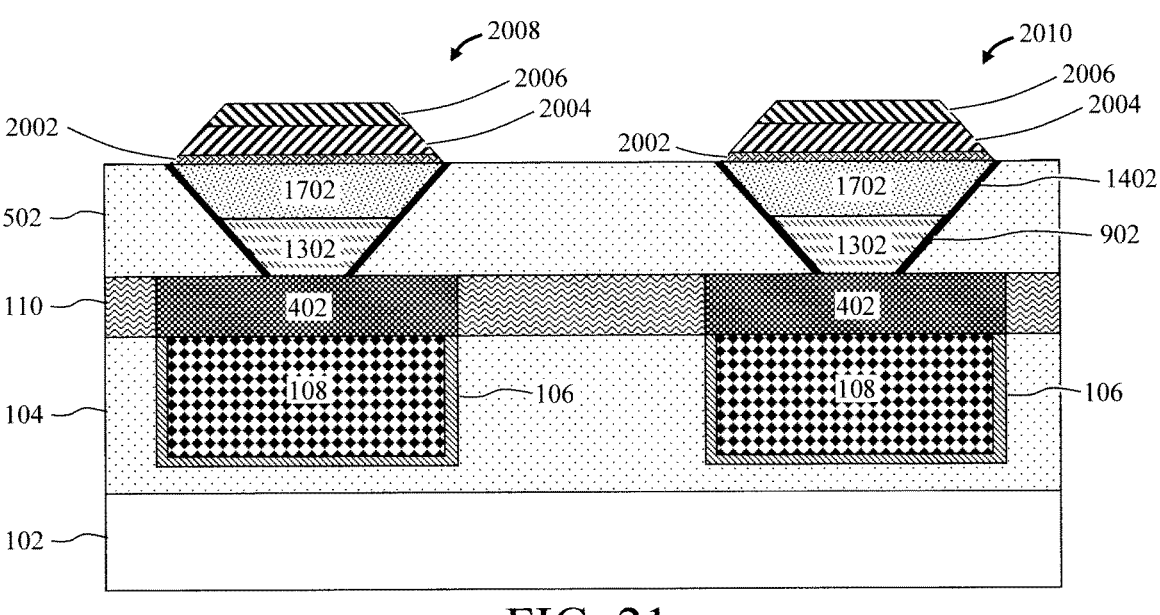
FIG. 21 is a cross-sectional diagram illustrating the patterned hardmask having been removed following the tapered etch according to an embodiment of the present invention.

As shown in FIG. 20, a tapered etch using the patterned hardmask 1902 is then performed to create tunnel barriers 2002 on the reference layers 1702, free layers 2004 on the tunnel barriers 2002, and top electrodes 2006 on the free layers 2004 from the blanket tunnel barrier layer 1802, the blanket free layer 1804, and the blanket top electrode layer 1806, respectively, forming at least a first and a second diamond shaped memory cell pillar 2008 and 2010, respectively. The tunnel barriers 2002, free layers 2004, and top electrodes 2006 will also be referred to herein collectively as the 'top halves' of the present diamond shaped memory cell pillars 2008 and 2010.

As shown in FIG. 20, the tunnel barriers 2002, the free layers 2004 and the top electrodes 2006 share common tapered sidewalls. i.e., which taper outward from the top of the memory cell pillars to the middle. As a result, the top of each of the diamond shaped memory cell pillars 2008 and 2010 (labeled 'top') has a width $W_{TOP}$, the bottom of each of the diamond shaped memory cell pillars 2008 and 2010 (labeled 'bottom') has a width $W_{BOTTOM}$, and the middle of each of the diamond shaped memory cell pillars 2008 and 2010 (labeled 'top') has a width $W_{MIDDLE}$, where $W_{MIDDLE} > W_{TOP}$, and $W_{MIDDLE} > W_{BOTTOM}$, thereby giving the memory cell pillars 2008 and 2010 their distinct diamond shape. The components above the middle of each of the diamond shaped memory cell pillars 2008 and 2010 (e.g., the tunnel barriers 2002, the free layers 2004 and the top electrodes 2006) are also collectively referred to herein as the top half of the diamond shaped memory cell pillars 2008 and 2010, whereas the components below the middle of each of the diamond shaped memory cell pillars 2008 and 2010 (e.g., the bottom electrodes 1302 and the reference layers 1702) are also collectively referred to herein as the bottom half of the diamond shaped memory cell pillars 2008 and 2010 on which the top half is formed.

According to an exemplary embodiment, the tapered etch is performed using an ion beam etching process. As provided above, ion beam etching advantageously enables a sample to be tilted in order to alter the direction of impact of the ion beam, thereby achieving an angled etch such as that which is used to create the tapered sidewall of the tunnel barriers 2002, the free layers 2004 and the top electrodes 2006. Following the tapered etch, what remains of the patterned hardmask 1902 is removed. See FIG. 21.

Figure 22:
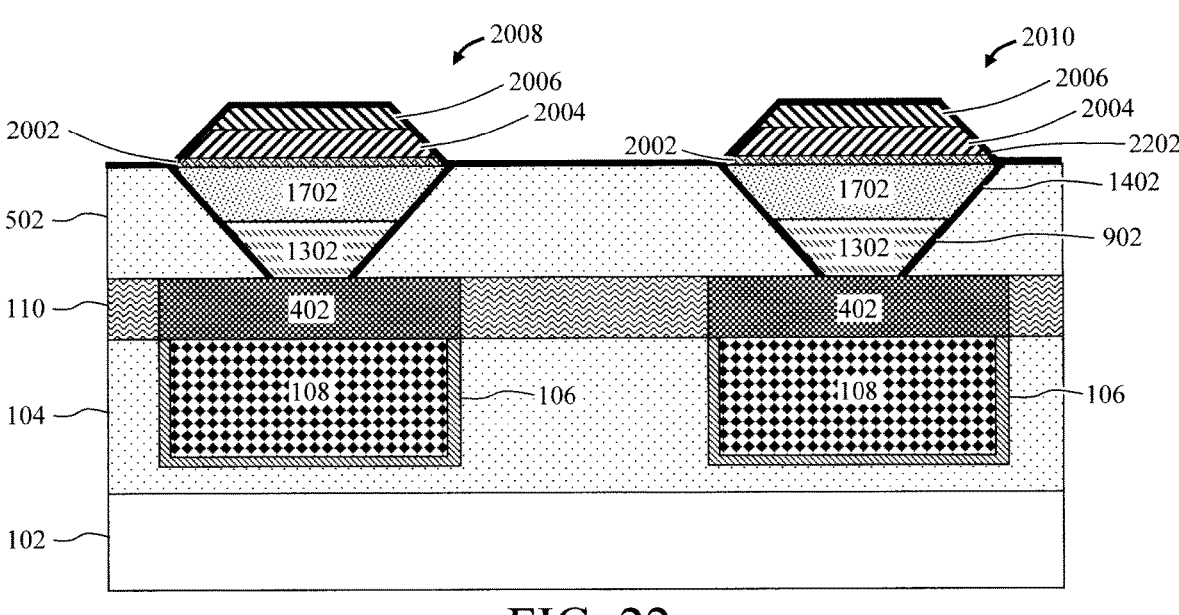
FIG. 22 is a cross-sectional diagram illustrating a second encapsulation layer having been deposited onto the second interlayer dielectric, and onto/over the tunnel barriers, the free layers and the top electrodes according to an embodiment of the present invention.

As shown in FIG. 22, an encapsulation layer 2202 is next deposited onto the interlayer dielectric 502, and onto/over the tunnel barriers 2002, the free layers 2004 and the top electrodes 2006. The as-deposited encapsulation layer 2202 is conformal to the topography of the interlayer dielectric 502 and the top half of the diamond shaped memory cell pillars 2008 and 2010 extending up from the interlayer dielectric 502. More specifically, the encapsulation layer 2202 directly contacts the interlayer dielectric 502 along its top surface and along the tapered (common) sidewalls of the tunnel barriers 2002, the free layers 2004 and the top electrodes 2006.

In the present example, the material for the encapsulation layer 2202 (which will also be referred to herein generally as a 'second' encapsulation layer) is selected from the same group of (e.g., nitride) dielectric materials as the encapsulation layer 902/encapsulation layer 1402 (i.e., collectively the 'first' encapsulation layer, see above). Namely, according to an exemplary embodiment, the encapsulation layer 902, the encapsulation layer 1402, and the encapsulation layer 2202 are each formed from a nitride dielectric material selected from SiN, SiAlN and/or SiCN. This includes scenarios where the compositions of the encapsulation layers 902, 1402 and 2202 differ (e.g., one can be formed from SiN, while another is formed from SiAlN, and so on). However, embodiments are also contemplated herein where the same material is used in all three encapsulation layers 902, 1402 and 2202 (e.g., they are all formed from SiN). Further, an alternative embodiment will also be presented below where different (e.g., oxide and nitride) dielectric materials will be used for the encapsulation layers along the bottom and top halves, respectively, of the diamond shaped memory cell pillars.

The encapsulation layer 2202 can be deposited using a process such as CVD, PECVD, ALD or PVD. According to an exemplary embodiment, the encapsulation layer 2202 has a thickness of from about 1 nm to about 5 nm.

Figures 23, 24:
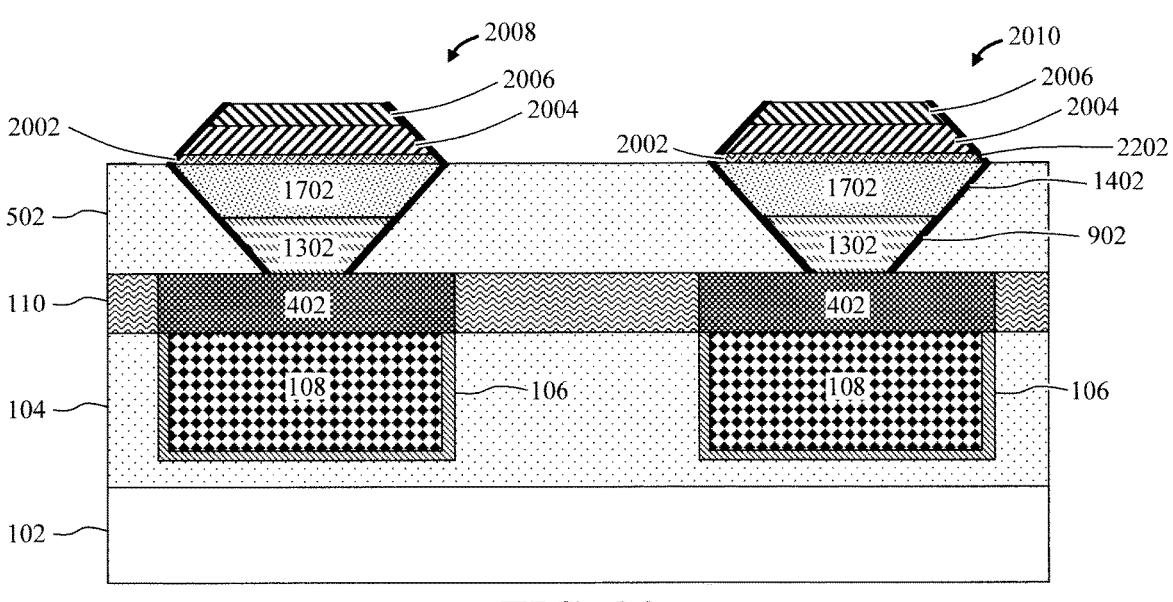
FIG. 23 is a cross-sectional diagram illustrating an etch-back of the second encapsulation layer having been performed according to an embodiment of the present invention.
FIG. 24 is a cross-sectional diagram illustrating a third interlayer dielectric having been deposited onto the second interlayer dielectric over the tunnel barriers, the free layers, the top electrodes and the second encapsulation layer according to an embodiment of the present invention.

As shown in FIG. 23, an etch-back of the encapsulation layer 2202 is next performed, which removes the encapsulation layer 2202 from all horizontal surfaces including from the top surface of the interlayer dielectric 502 and from the top surface of the top electrodes 2006. According to an exemplary embodiment, etch-back of the encapsulation layer 2202 is performed using a directional (i.e., anisotropic) etching process such as reactive ion etching. As a result, the encapsulation layer 2202 is now present, as shown in FIG. 23, only along the tapered (common) sidewalls of the tunnel barriers 2002, the free layers 2004 and the top electrodes 2006.

As shown in FIG. 24, an interlayer dielectric 2402 is then deposited onto the interlayer dielectric 502 over the tunnel barriers 2002, the free layers 2004, the top electrodes 2006 and encapsulation layer 2202, i.e., the top half of the diamond shaped memory cell pillars 2008 and 2010. For clarity, the term 'third' may also be used herein when referring to the interlayer dielectric 2402 so as to distinguish it from the 'first' interlayer dielectric 104 and 'second' interlayer dielectric 502. Suitable interlayer dielectric 2402 materials include, but are not limited to, SiN, SiOC and/or oxide low-κ materials such as SiOx and/or ULK-ILD materials such as pSiCOH, which can be deposited using a process such as CVD, ALD or PVD. Following deposition, the interlayer dielectric 2402 can be planarized using a process such as chemical-mechanical polishing.

Notably, the present process decouples fabrication of the bottom half from the top half of the diamond shaped memory cell pillars 2008 and 2010 which, as described above, involves the deposition of two separate interlayer dielectrics 502 and 2402 for the bottom and top halves, respectively. That coupled with the tapered/diamond shaped sidewall design provides for a low (height to width) aspect ratio for the interlayer dielectric 2402 gapfill which eliminates the risk of any voids forming in the interlayer dielectric 2402 between the diamond shaped memory cell pillars 2008 and 2010. To look at it another way, the interlayer dielectric 2402 fully fills the gap between the diamond shaped memory cell pillars 2008 and 2010, which would not be the case if there were voids present. Further, since a blanket interlayer dielectric 502 was deposited prior to forming the diamond shaped memory cell pillars 2008 and 2010, there is no chance of any voids being present in the interlayer dielectric 502 either. By contrast, with conventional processes where subtractive patterning is used to form pillars, followed by dielectric gapfill, the dielectric is being deposited into a high aspect ratio inter-pillar space. As a result, voids in the dielectric are prevalent.

Figure 25:
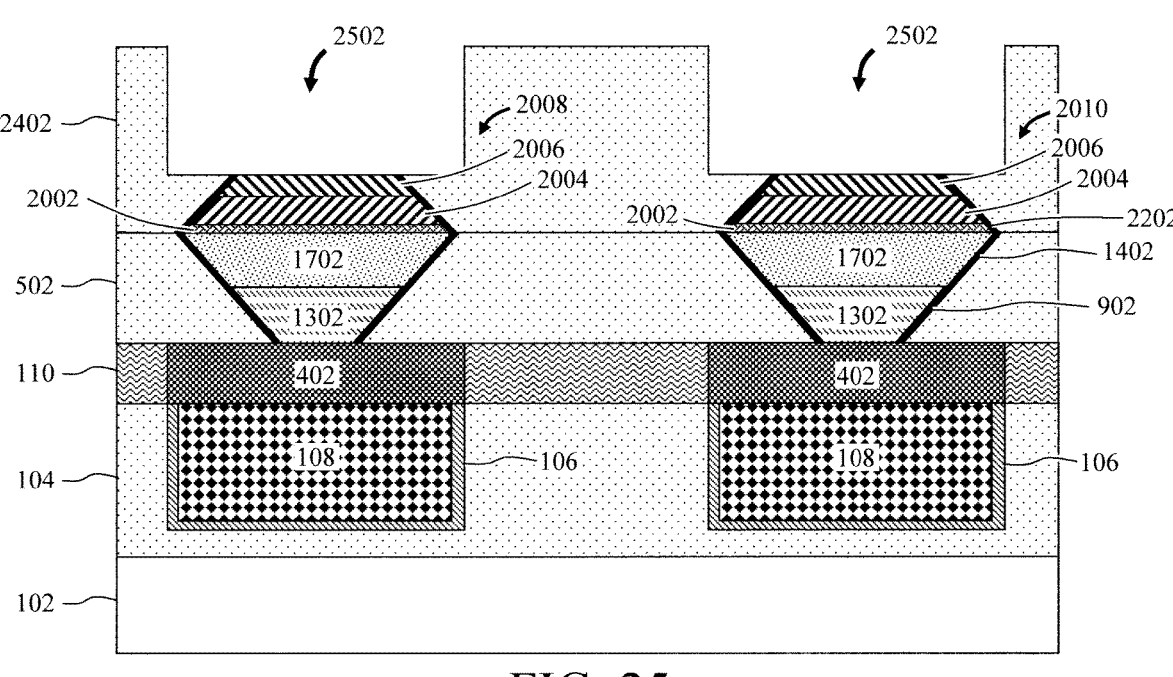
FIG. 25 is a cross-sectional diagram illustrating features having been patterned in the third interlayer dielectric over each of the diamond shaped memory cell pillars exposing the top electrodes according to an embodiment of the present invention.

As shown in FIG. 25, standard lithography and etching techniques (see above) are used to pattern features 2502 (e.g., trenches and/or vias) in the interlayer dielectric 2402 over each of the diamond shaped memory cell pillars 2008 and 2010. The top electrodes 2006 are now exposed at the bottoms of the features 2502.

Figure 26:
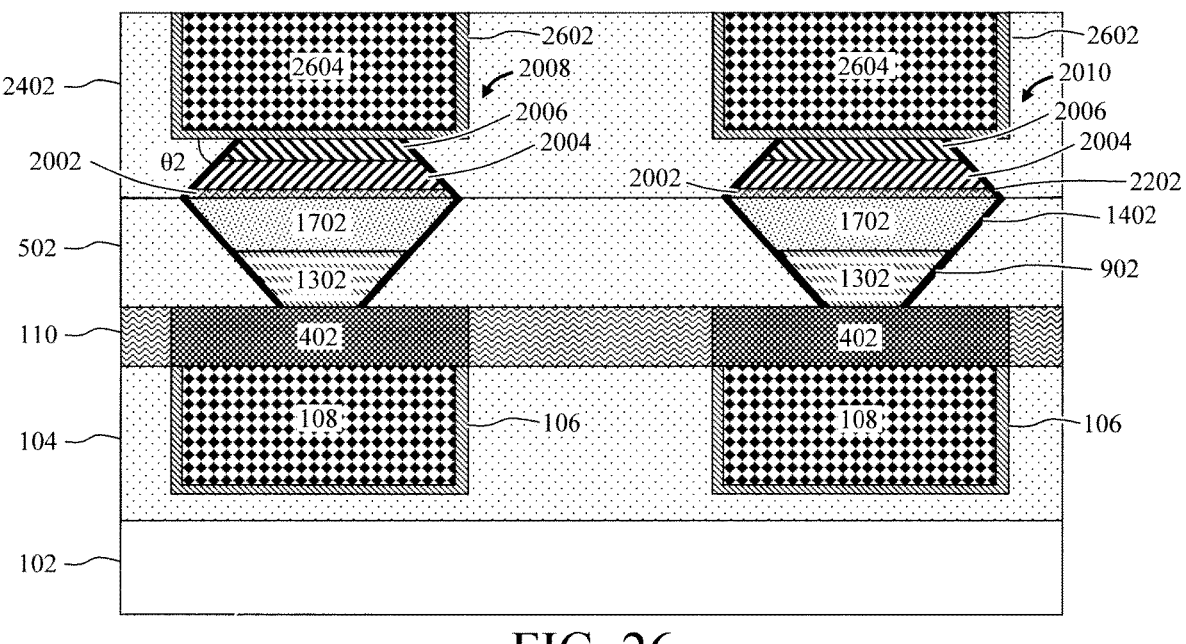
FIG. 26 is a cross-sectional diagram illustrating the features having been filled with a contact metal(s) to form metal line(s) over each of the diamond shaped memory cell pillars according to an embodiment of the present invention.

As shown in FIG. 26, the features 2502 are then filled with a contact metal(s) to form metal line(s) 2604 over each of the diamond shaped memory cell pillars 2008 and 2010. For clarity, the terms 'first' 'and second' may also be used herein when referring to metal lines 108 and 2604, respectively. As provided above, suitable contact metals include, but are not limited to. Cu, Ni, Pt, Ru, Co and/or W, which can be deposited using a process such as evaporation, sputtering, or electrochemical plating. Following deposition, the metal overburden can be removed using a process such as chemical-mechanical polishing.

Prior to depositing the contact metal(s) into the features, a conformal barrier layer 2602 can be deposited into and lining the features. Use of such a barrier layer helps to prevent diffusion of the contact metal(s) into the surrounding interlayer dielectric 2402. As provided above, suitable barrier layer materials include, but are not limited to, Ru, Ta, TaN. Ti, and/or TiN. Additionally, a seed layer (not shown) can be deposited into and lining the features prior to deposition of the contact metal(s). A seed layer facilitates plating of the contact metal(s) into the features.

Notably, based on the diamond shaped profile of the memory cell pillars 2008 and 2010, according to an exemplary embodiment, one of the common sidewalls of the tunnel barriers 2002, the free layers 2004 and the top electrodes 2006 in each of the memory cell pillars 2008 and 2010 forms an angle θ2 of from about 30 degrees to about 50 degrees relative to the bottom surfaces of the metal line(s) 2604.

Figure 27:
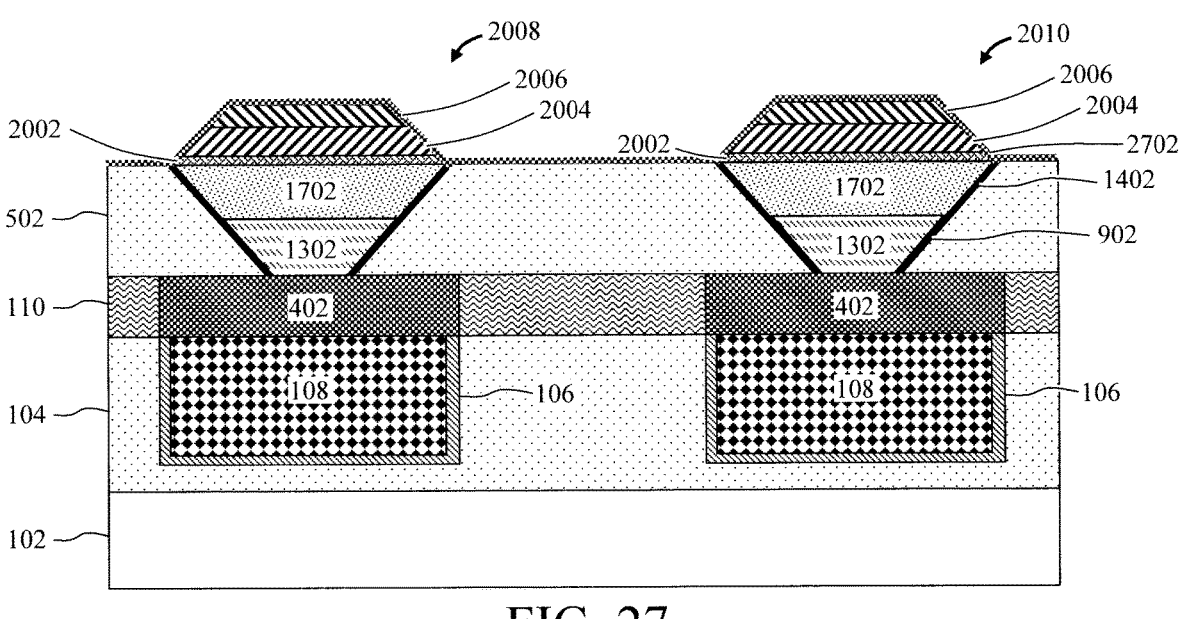
FIG. 27 is a cross-sectional diagram illustrating, according to an alternative embodiment, a second (different) encapsulation layer having been deposited onto the second interlayer dielectric, and onto/over the tunnel barriers, the free layers and the top electrodes according to an embodiment of the present invention.

As highlighted above, embodiments are also contemplated herein where different materials are employed in the first encapsulation layer along the bottom electrodes 1302 and the reference layers 1702 versus the second encapsulation layer along the tunnel barriers 2002, the free layers 2004 and the top electrodes 2006. This alternative embodiment is now described by way of reference to FIGS. 27-31. The process begins in the same manner as described in conjunction with the description of FIGS. 1-21 above. Thus, what is depicted in FIG. 27 follows from the device architecture shown in FIG. 21. Like structures are numbered alike in the figures. In this example, however, oxide dielectric materials will be used as the first encapsulation layer, i.e., along the bottom electrodes 1302 and the reference layers 1702, whereas nitride dielectric materials will be used as the second encapsulation layer, i.e., along the tunnel barriers 2002, the free layers 2004 and the top electrodes 2006. As such, according to this alternative embodiment, encapsulation layers 902 and 1402 are each formed from an oxide dielectric material such as $HfO_2$ and/or $Y_2O_3$.

As shown in FIG. 27, an encapsulation layer 2702 is next deposited onto the interlayer dielectric 502, and onto/over the tunnel barriers 2002, the free layers 2004 and the top electrodes 2006. The as-deposited encapsulation layer 2702 is conformal to the topography of the interlayer dielectric 502 and the top half of the diamond shaped memory cell pillars 2008 and 2010 extending up from the interlayer dielectric 502. More specifically, the encapsulation layer 2702 directly contacts the interlayer dielectric 502 along its top surface and along the tapered (common) sidewalls of the tunnel barriers 2002, the free layers 2004 and the top electrodes 2006.

In the present example, the material for the encapsulation layer 2702 (which will also be referred to herein generally as a 'second' encapsulation layer) is selected from a different group of (e.g., nitride) dielectric materials from the group of (e.g., oxide) dielectric materials used for the encapsulation layer 902/encapsulation layer 1402 (i.e., collectively the 'first' encapsulation layer, see above). Namely, according to an exemplary embodiment, the encapsulation layer 2702 is formed from a nitride dielectric material such as SiN and/or SiCN. By comparison, as provided above, the encapsulation layer 902/encapsulation layer 1402 in this example are each formed from an oxide dielectric material such as $HfO_2$ and/or $Y_2O_3$. As provided above, varying the encapsulation layer materials allows design flexibility in terms of the type of interlayer dielectric materials which can be used, having good adhesion to specific encapsulation materials, and it allows tailoring of overall capacitance.

The encapsulation layer 2702 can be deposited using a process such as CVD, PECVD, ALD or PVD. According to an exemplary embodiment, the encapsulation layer 2702 has a thickness of from about 1 nm to about 5 nm.

Figure 28:
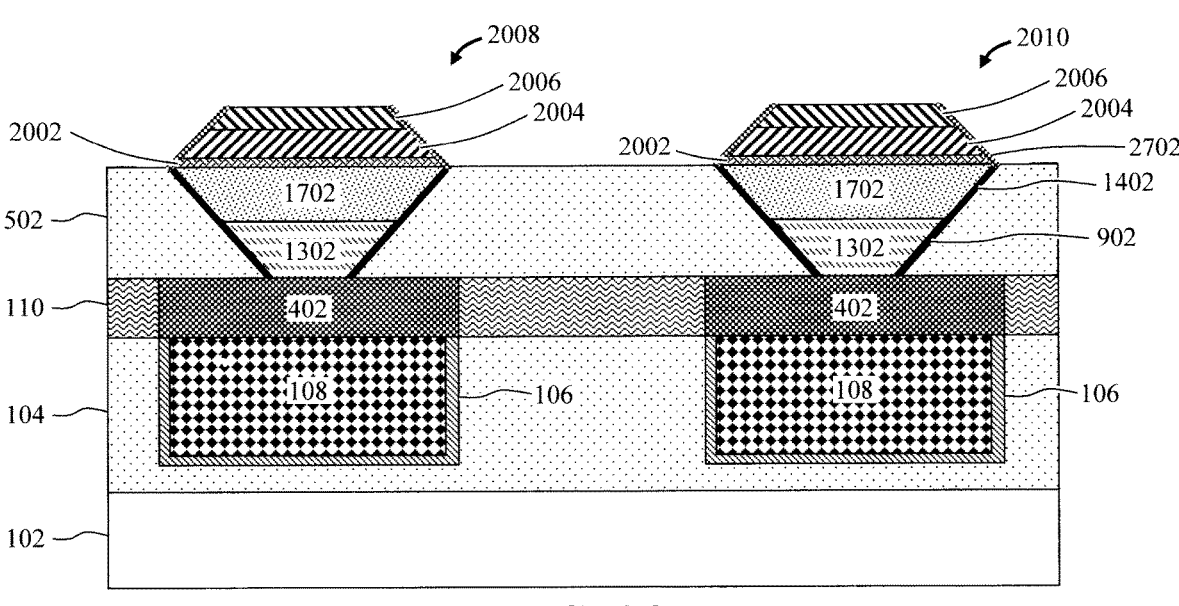
FIG. 28 is a cross-sectional diagram illustrating an etch-back of the second encapsulation layer having been performed according to an embodiment of the present invention.

As shown in FIG. 28, an etch-back of the encapsulation layer 2702 is next performed, which removes the encapsulation layer 2702 from all horizontal surfaces including from the top surface of the interlayer dielectric 502 and from the top surface of the top electrodes 2006. According to an exemplary embodiment, etch-back of the encapsulation layer 2702 is performed using a directional (i.e., anisotropic) etching process such as reactive ion etching. As a result, the encapsulation layer 2702 is now present, as shown in FIG. 28, only along the tapered (common) sidewalls of the tunnel barriers 2002, the free layers 2004 and the top electrodes 2006.

Figures 29, 30:
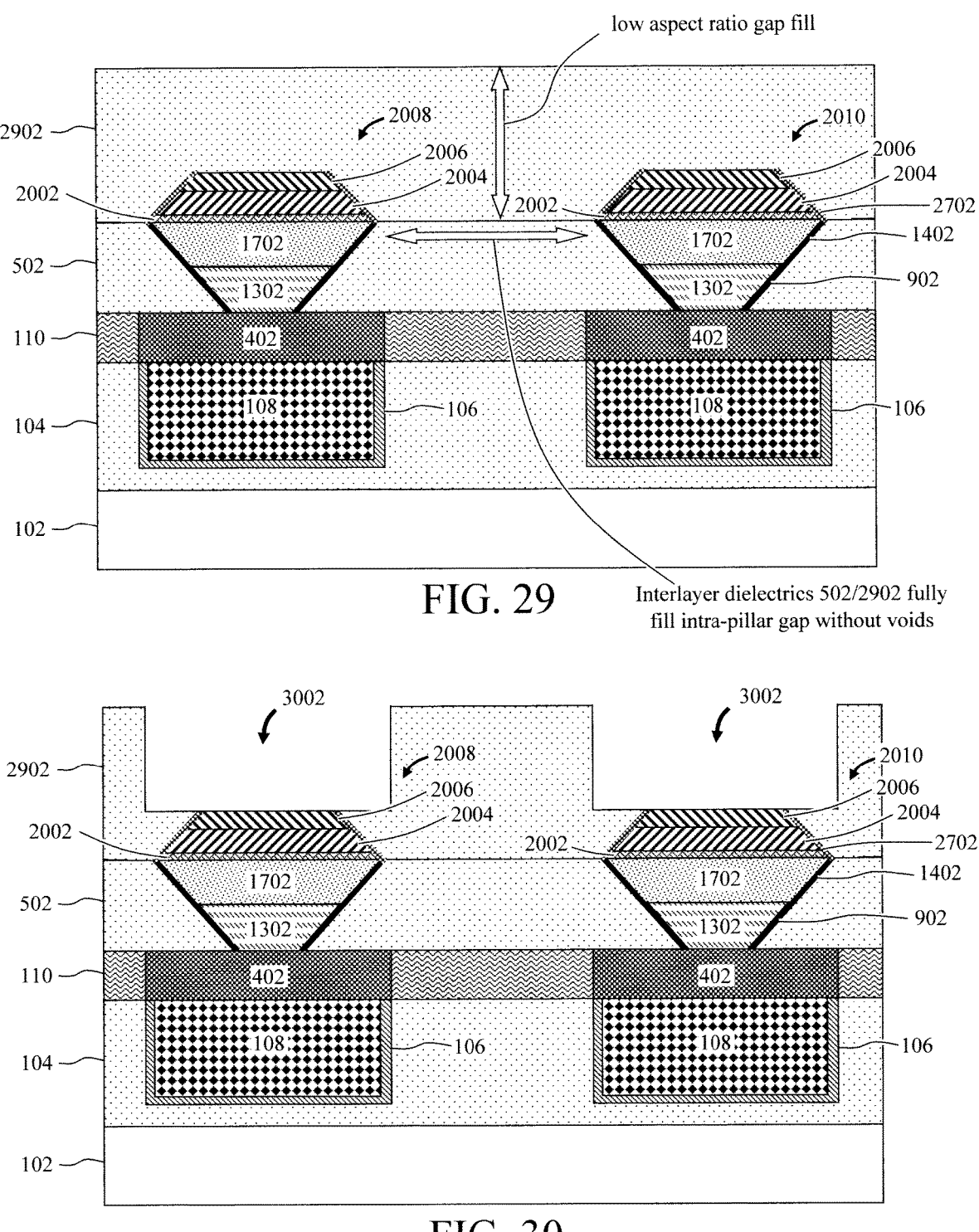
FIG. 29 is a cross-sectional diagram illustrating a third interlayer dielectric having been deposited onto the second interlayer dielectric over the tunnel barriers, the free layers, the top electrodes and the second encapsulation layer according to an embodiment of the present invention.
FIG. 30 is a cross-sectional diagram illustrating features having been patterned in the third interlayer dielectric over each of the diamond shaped memory cell pillars exposing the top electrodes according to an embodiment of the present invention.

As shown in FIG. 29, an interlayer dielectric 2902 is then deposited onto the interlayer dielectric 502 over the tunnel barriers 2002, the free layers 2004, the top electrodes 2006 and encapsulation layer 2702. For clarity, the term 'third' may also be used herein when referring to the interlayer dielectric 2902 so as to distinguish it from the 'first' interlayer dielectric 104 and 'second' interlayer dielectric 502. Suitable interlayer dielectric 2902 materials include, but are not limited to, SiN, SiOC and/or oxide low-K materials such as SiOx and/or ULK-ILD materials such as pSiCOH, which can be deposited using a process such as CVD, ALD or PVD. Following deposition, the interlayer dielectric 2902 can be planarized using a process such as chemical-mechanical polishing.

Notably, the present process decouples fabrication of the bottom half from the top half of the diamond shaped memory cell pillars 2008 and 2010 which, as described above, involves the deposition of two separate interlayer dielectrics 502 and 2902 for the bottom and top halves, respectively. That coupled with the tapered/diamond shaped sidewall design provides for a low (height to width) aspect ratio for the interlayer dielectric 2902 gapfill which eliminates the risk of any voids forming in the interlayer dielectric 2902 between the diamond shaped memory cell pillars 2008 and 2010. To look at it another way, the interlayer dielectric 2902 fully fills the gap between the diamond shaped memory cell pillars 2008 and 2010, which would not be the case if there were voids present. Further, since a blanket interlayer dielectric 502 was deposited prior to forming the diamond shaped memory cell pillars 2008 and 2010, there is no chance of any voids being present in the interlayer dielectric 502 either. By contrast, with conventional processes where subtractive patterning is used to form pillars, followed by dielectric gapfill, the dielectric is being deposited into a high aspect ratio inter-pillar space. As a result, voids in the dielectric are prevalent.

As shown in FIG. 30, standard lithography and etching techniques (see above) are used to pattern features 3002 (e.g., trenches and/or vias) in the interlayer dielectric 2902 over each of the diamond shaped memory cell pillars 2008 and 2010. The top electrodes 2006 are now exposed at the bottoms of the features 3002.

Figure 31:
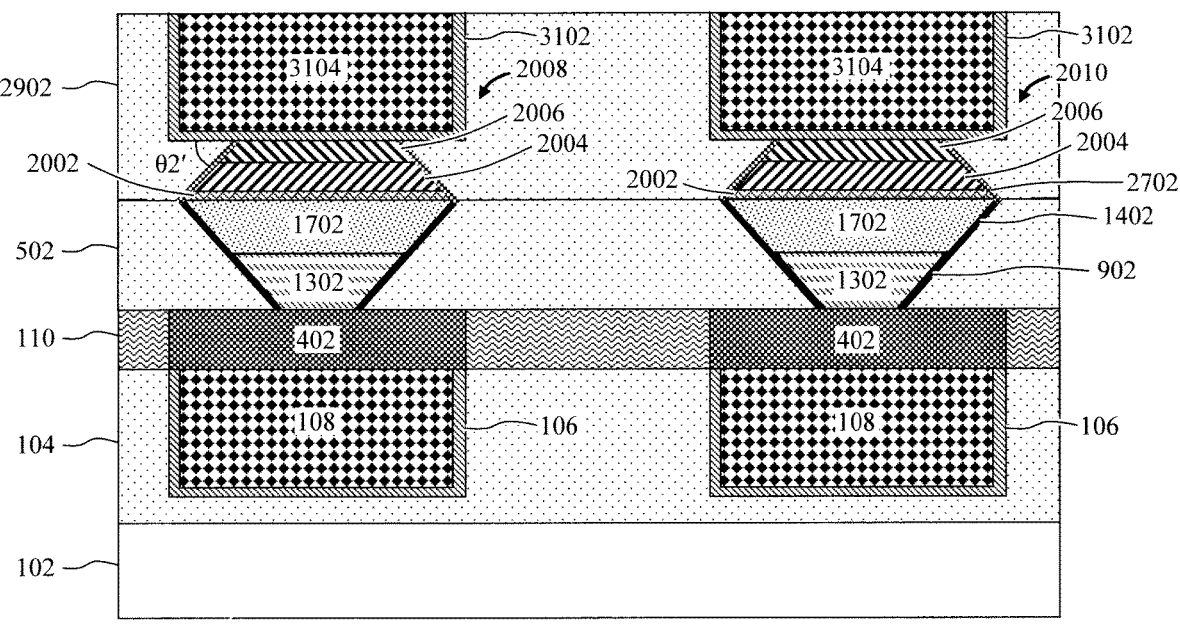
FIG. 31 is a cross-sectional diagram illustrating the features having been filled with a contact metal(s) to form metal line(s) over each of the diamond shaped memory cell pillars according to an embodiment of the present invention.

As shown in FIG. 31, the features 3002 are then filled with a contact metal(s) to form metal line(s) 3104 over each of the diamond shaped memory cell pillars 2008 and 2010. For clarity, the terms 'first' and 'second' may also be used herein when referring to metal lines 108 and 3104, respectively. As provided above, suitable contact metals include, but are not limited to, Cu, Ni, Pt, Ru, Co and/or W, which can be deposited using a process such as evaporation, sputtering, or electrochemical plating. Following deposition, the metal overburden can be removed using a process such as chemical-mechanical polishing.

Prior to depositing the contact metal(s) into the features, a conformal barrier layer 3102 can be deposited into and lining the features. Use of such a barrier layer helps to prevent diffusion of the contact metal(s) into the surrounding interlayer dielectric 2902. As provided above, suitable barrier layer materials include, but are not limited to, Ru, Ta, TaN, Ti, and/or TiN. Additionally, a seed layer (not shown) can be deposited into and lining the features prior to deposition of the contact metal(s). A seed layer facilitates plating of the contact metal(s) into the features.

Notably, based on the diamond shaped profile of the memory cell pillars 2008 and 2010, according to an exemplary embodiment, one of the common sidewalls of the tunnel barriers 2002, the free layers 2004 and the top electrodes 2006 in each of the memory cell pillars 2008 and 2010 forms an angle θ2' of from about 30 degrees to about 50 degrees relative to the bottom surfaces of the metal line(s) 3104.

Although illustrative embodiments of the present invention have been described herein, it is to be understood that the invention is not limited to those precise embodiments, and that various other changes and modifications may be made by one skilled in the art without departing from the scope of the invention.

What is claimed is:
1. A magnetic random access memory (MRAM) device, comprising:
    memory cell pillars having a diamond shaped profile, wherein each of the memory cell pillars comprises a reference layer, a free layer, a tunnel barrier between the reference layer and the free layer, a first encapsulation layer alongside the reference layer, and a second encapsulation layer alongside the free layer;
    a bottom electrode on which the reference layer is disposed, wherein the bottom electrode and the reference layer share common sidewalls that taper inward from a middle to a bottom of each of the memory cell pillars; and a top electrode disposed on the free layer, wherein the top electrode and the free layer share common sidewalls that taper outward from a top to the middle of each of the memory cell pillars.

2. The MRAM device of claim 1, wherein the first encapsulation layer comprises an oxide dielectric material, and wherein the second encapsulation layer comprises a nitride dielectric material.

3. The MRAM device of claim 2, wherein the oxide dielectric material is selected from the group consisting of: hafnium oxide (HfO2), yttrium oxide (Y2O3), and combinations thereof.

4. The MRAM device of claim 2, wherein the nitride dielectric material is selected from the group consisting of: SiN, SiCN, and combinations thereof.

5. The MRAM device of claim 1, wherein each of the memory cell pillars has a top with a width WTOP, a bottom with a width WBOTTOM, and a middle with a width WMIDDLE, wherein WMIDDLE>WTOP, and wherein WMIDDLE>WBOTTOM.

6. The MRAM device of claim 5, wherein the reference layer is below the middle of each of the memory cell pillars, and wherein the free layer is above the middle of each of memory cell pillars.

7. The MRAM device of claim 1, further comprising:
an interlayer dielectric fully filling gaps between the memory cell pillars.

8. A magnetic random access memory (MRAM) device, comprising:
memory cell pillars having a diamond shaped profile; and
a bottom electrode on which a reference layer is disposed, wherein the bottom electrode and the reference layer share common sidewalls that taper inward from a middle to a bottom of each of the memory cell pillars.

9. The MRAM device of claim 8, further comprising:
an interlayer dielectric fully filling gaps between the memory cell pillars.

10. The MRAM device of claim 8, wherein each of the memory cell pillars has a top with a width WTOP, a bottom with a width WBOTTOM, and a middle with a width WMIDDLE, wherein WMIDDLE>WTOP, and wherein WMIDDLE>WBOTTOM.

11. The MRAM device of claim 8, wherein each of the memory cell pillars comprises:
a free layer; and
a tunnel barrier between the reference layer and the free layer, and wherein the reference layer is below the middle of each of the memory cell pillars, and wherein the free layer is above the middle of each of the memory cell pillars.

12. The MRAM device of claim 11, further comprising:
a first encapsulation layer along sidewalls of the reference layer, and a second encapsulation layer along sidewalls of the free layer.

13. The MRAM device of claim 12, wherein the first encapsulation layer and the second encapsulation layer each comprise a material selected from the group consisting of: silicon nitride (SiN), aluminum doped silicon nitride (SiAlN), silicon carbonitride (SiCN), and combinations thereof.

14. The MRAM device of claim 8, further comprising:
first metal lines beneath the memory cell pillars;
metal caps disposed on the first metal lines, wherein the metal caps are present between the first metal lines and the memory cell pillars; and
second metal lines above the memory cell pillars.

15. A magnetic random access memory (MRAM) device, comprising:
memory cell pillars having a diamond shaped profile; and
a top electrode disposed on a free layer, wherein the top electrode and the free layer share common sidewalls that taper outward from a top to a middle of each of the memory cell pillars.

16. The MRAM device of claim 15, further comprising:
an interlayer dielectric fully filling gaps between the memory cell pillars.

17. The MRAM device of claim 15, wherein each of the memory cell pillars has a top with a width WTOP, a bottom with a width WBOTTOM, and a middle with a width WMIDDLE, wherein WMIDDLE>WTOP, and wherein WMIDDLE>WBOTTOM.

18. The MRAM device of claim 15, wherein each of the memory cell pillars comprises:
a reference layer; and
a tunnel barrier between the reference layer and the free layer, and wherein the reference layer is below the middle of each of the memory cell pillars, and wherein the free layer is above the middle of each of the memory cell pillars.

19. The MRAM device of claim 18, further comprising:
a first encapsulation layer along sidewalls of the reference layer, and a second encapsulation layer along sidewalls of the free layer.

20. The MRAM device of claim 19, wherein the first encapsulation layer and the second encapsulation layer each comprise a material selected from the group consisting of: silicon nitride (SiN), aluminum doped silicon nitride (SiAlN), silicon carbonitride (SiCN), and combinations thereof.

21. The MRAM device of claim 15, further comprising:
first metal lines beneath the memory cell pillars;
metal caps disposed on the first metal lines, wherein the metal caps are present between the first metal lines and the memory cell pillars; and
second metal lines above the memory cell pillars.

* * * * *